United States Patent [19]
Biche et al.

[11] Patent Number: 5,935,768
[45] Date of Patent: Aug. 10, 1999

[54] METHOD OF PROCESSING A SUBSTRATE IN A PHOTOLITHOGRAPHY SYSTEM UTILIZING A THERMAL PROCESS MODULE

[75] Inventors: Michael R. Biche, Union City; H. Alexander Anderson, Santa Cruz, both of Calif.

[73] Assignee: Semiconductor Systems, Inc., Fremont, Calif.

[21] Appl. No.: 08/872,345

[22] Filed: Jun. 10, 1997

Related U.S. Application Data

[63] Continuation of application No. 08/609,959, Mar. 4, 1996, abandoned, which is a continuation of application No. 08/321,353, Oct. 11, 1994, abandoned, which is a division of application No. 08/093,250, Jul. 16, 1993, abandoned.

[51] Int. Cl.$^6$ ....................................................... G03F 7/40
[52] U.S. Cl. ......................... 430/401; 414/225; 414/749; 414/751; 901/16; 901/39; 430/330

[56] References Cited

U.S. PATENT DOCUMENTS

| 4,842,683 | 6/1989 | Cheng et al. | 156/345 |
|---|---|---|---|
| 4,985,722 | 1/1991 | Ushijima et al. | 354/319 |
| 5,061,144 | 10/1991 | Akimoto et al. | 414/225 |

FOREIGN PATENT DOCUMENTS

| 0253 162 A2 | 1/1988 | European Pat. Off. . |
|---|---|---|
| 0462 459 A1 | 12/1991 | European Pat. Off. . |
| 60-27141 | 2/1985 | Japan . |
| 63-39931 | 3/1988 | Japan . |
| 63-65639 | 3/1988 | Japan . |
| 63-90841 | 6/1988 | Japan . |
| 2-196414 | 8/1990 | Japan . |
| 3-54844 | 3/1991 | Japan . |
| 4-155848 | 5/1992 | Japan . |
| 4-181717 | 6/1992 | Japan . |
| 4-357823 | 10/1992 | Japan . |

*Primary Examiner*—Christopher G. Young
*Attorney, Agent, or Firm*—Omkar K. Suryadevara; Skjerven, Morrill, MacPherson, Franklin & Friel LLP

[57] ABSTRACT

An apparatus and a method for baking and cooling silicon substrates are disclosed. Both baking and cooling of silicon substrates are done in a single integrated thermal process module. Each thermal process module includes two hot plate assemblies, a cool plate assembly, two local linear transfer arms and a micro-processor based module controller. Both transfer arms are capable of transferring substrates among the cool and hot plate assemblies. The module controller ensures that there are no conflicts in use of the transfer arms or in use of the hot and cool plate assemblies and so that a transfer arm is always available when a substrate is finished baking. A central substrate handling robot transports substrates only from and to the cool plate assembly of the thermal process module. Also, the vacuum tubing is routed via a unique pulley arrangement to achieve compact mounting and eliminate loose tubing.

24 Claims, 14 Drawing Sheets

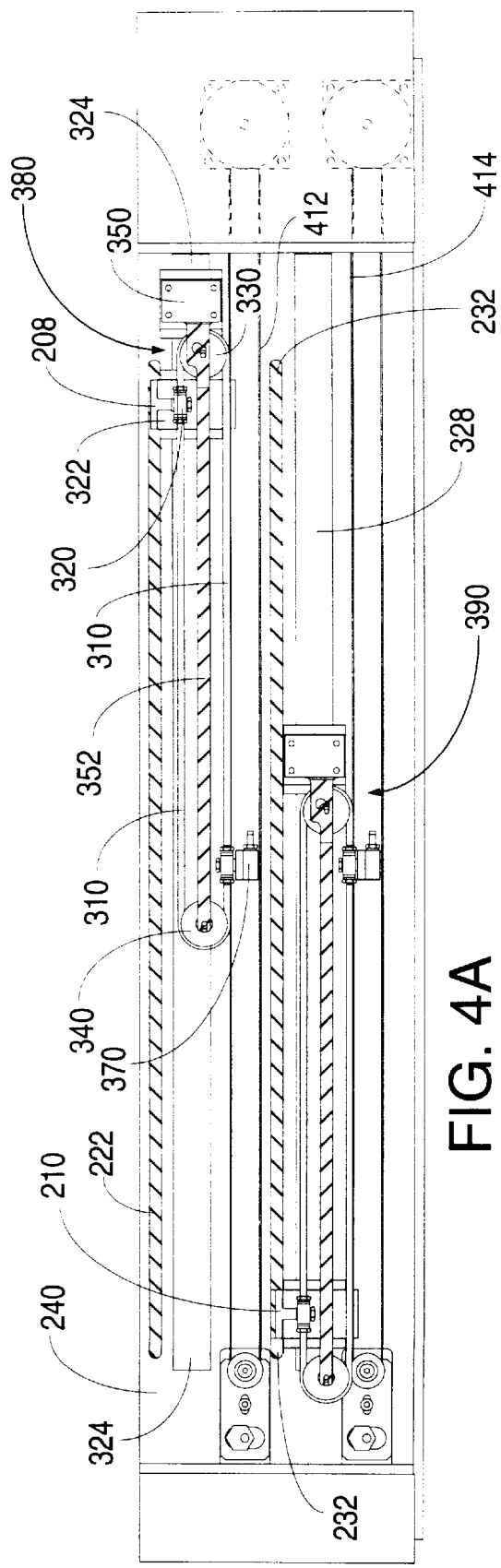
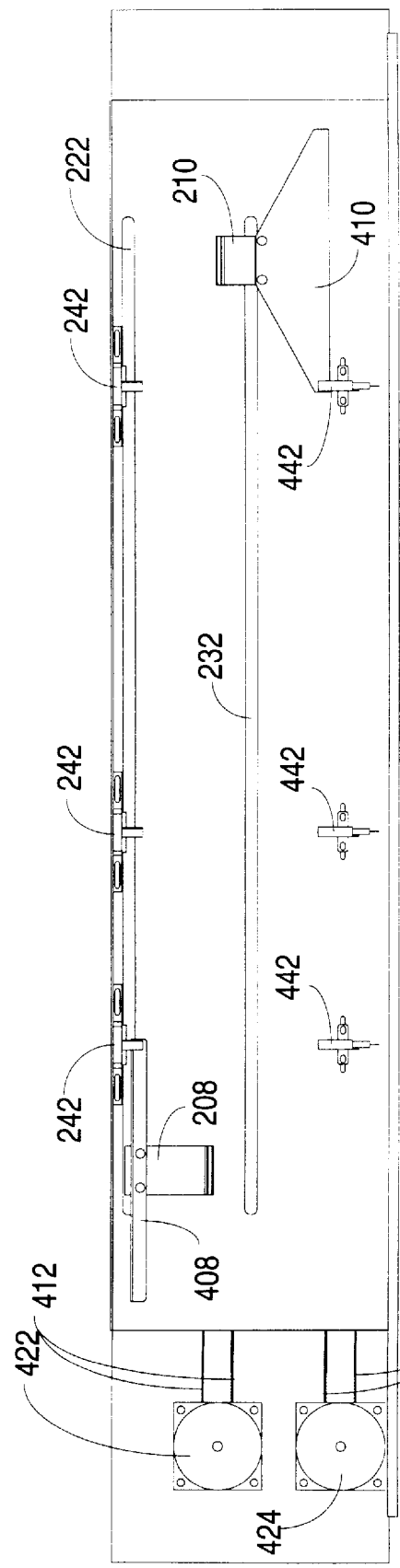
FIG. 4A
FIG. 4B

METHOD OF PROCESSING A SUBSTRATE IN A PHOTOLITHOGRAPHY SYSTEM UTILIZING A THERMAL PROCESS MODULE

This application is a continuation of application Ser. No. 08/609,959, filed Mar. 4, 1996 now abandoned, which is a continuation of application Ser. No. 08/321,353 filed Oct. 11, 1994 now abandoned that was a division of application Ser. No. 08/093,250, filed Jul. 16, 1993, now abandoned.

FIELD OF THE INVENTION

This invention relates to substrate photolithography systems and, in particular, a system for heating and cooling semiconductor substrates in the course of forming a photoresist mask on the surface of the substrate.

BACKGROUND OF THE INVENTION

The process by which a photoresist mask is formed on a semiconductor substrate involves first coating the substrate with a thin layer of photoresist, exposing the resist with the desired pattern, and then developing the photoresist layer.

In performing this process, silicon substrates are placed on hot plates where they are baked at precise temperatures for precise periods of time. In a typical process, a clean substrate is initially subjected to a dehydration bake at 100°–150° C. to remove moisture. Then, after a thin layer of photoresist is applied to the substrate, the substrate is subjected to a "soft" bake at 90°–120° C. Again, after the photoresist has been exposed, the substrate is subjected to a post-exposure bake at 60°–120° C. Also, following a developing step, the substrate is subjected to a "hard" bake at 130°–160° C. to dry the substrate. After each of the foregoing heating steps, the substrate must be cooled to room temperature in order to assure a uniform process. Precise baking and cooling of silicon substrates is one of the most important processes used in the fabrication of very large scale integrated (VLSI) circuits.

All of these baking and cooling steps must be performed in a clean room which is temperature and humidity controlled and substantially free of dust and other particulate matter. In the prior art, the most common system for performing this process consists of a track arrangement in which the substrate is transported to successive stages in a sequence. This type of arrangement has a limited flexibility, since the substrates are locked in a fixed order.

In a less common type of arrangement, various hot plates and cool plates are positioned on two sides of a long central track and the substrates are transported between plates by a single robot which moves back and forth along the central track. Such prior art arrangements are extremely wasteful of floor area since no processing occurs in the track area.

In addition, in these prior art systems, if a single robot arm handles all the substrates, only one substrate may be serviced at any one time. Thus if two substrates are finished baking at the same time, only one of the substrates can be removed from the hot plate. The other substrate may be overbaked.

Also, in prior art systems, since a robot arm's end effector removes substrates from a hot plate, the end effector usually heats up over a period of time. When the hot end effector picks up a room temperature substrate having a recently coated photoresist layer, the photoresist layer may be heated non-uniformly in areas touched by the end effector. This may result in the photoresist coating being thicker in areas where the substrate was heated by the end effector. A 1° C. variation in temperature can result in 20 Å variation in thickness. Such variations are unacceptable since modern substrate processing must yield coatings of uniform thickness of 0.5 micron with variations no more than approximately 10 Å.

Furthermore, in the prior art, coiled vacuum lines are often used to supply vacuum for holding substrates in position. These vacuum lines, which extend through the equipment, may get in the way of robots, belts and other moving equipment and get chewed up and broken.

These problems are overcome in a thermal process module in accordance with this invention.

SUMMARY OF THE INVENTION

In a photolithography system according to this invention, the baking and cooling of semiconductor substrates is done inside an integrated thermal process module. The thermal process module is serviced by a central substrate handling robot which also services other units in the system.

Each thermal process module includes a cool plate assembly and two hot plate assemblies. The substrates are transported among the cool and hot plate assemblies inside the thermal process module by two local linear transfer arms which are built into the thermal process module. A microprocessor-based module controller ensures that there are no conflicts in use of the transfer arms or in use of the hot and cool plate assemblies. Since there are as many transfer arms as there are hot plates, a transfer arm is always available whenever a substrate is finished baking. Thus there is no danger of overbaking.

The central substrate handling robot transports the substrates from and to a thermal process module only via the cool plate assembly area of each thermal process module. Since the central robot's arm never picks up a hot substrate or transfers substrates from or to a hot plate, the robot's end effector never heats up. Thus there is no danger of localized non-uniform heating of substrates.

Finally, the vacuum tubing of the thermal process module is routed via a unique pulley arrangement to achieve a compact mounting which eliminates loose tubing.

BRIEF DESCRIPTION OF THE DRAWINGS

FIG. 4A illustrates a rear elevation view of the thermal process module.

FIG. 4B illustrates a front elevation view of the thermal process module.

DESCRIPTION OF THE INVENTION

Figure 1:
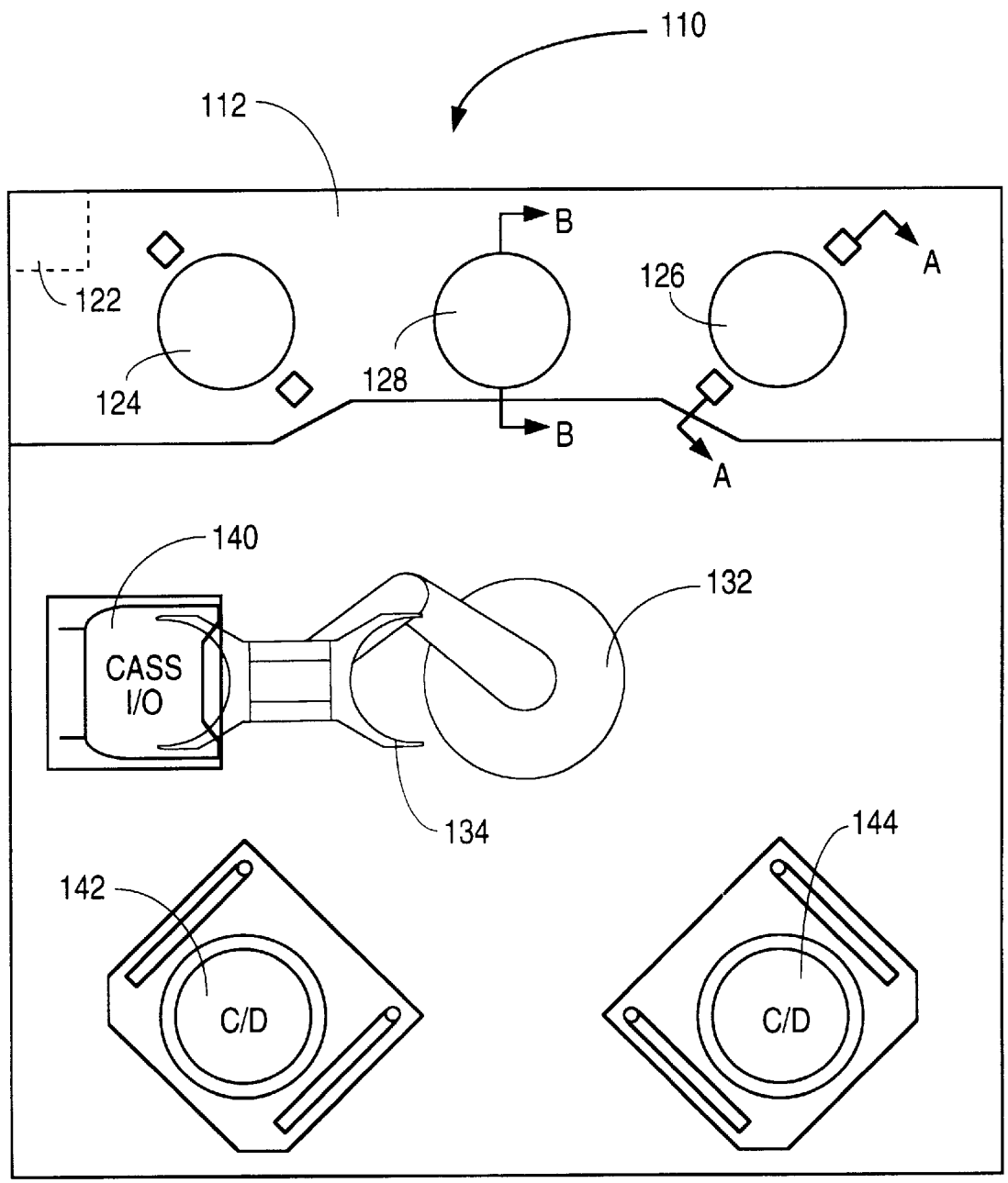
FIG. 1A illustrates a plan view of a clustered semiconductor wafer photolithography system in accordance with the invention.
FIG. 1B illustrates a front elevational view of the heating/cooling unit.
FIG. 1C illustrates a front elevational view of the wafer cassette.
FIG. 1D illustrates a side elevational view of the heating/cooling unit and the robot.
FIGS. 1E–1H illustrate plan views of alternative embodiments in accordance with the invention.

This invention will be described in terms of a semiconductor wafer photolithography system, but is has wide applicability to any type of substrate photolithography system.

FIG. 1A illustrates a plan view of a semiconductor wafer photolithography system 10 in accordance with the invention. System 10 includes a wafer coating section 11 and a wafer developing section 12. At the center of coating section 11 is a wafer handling robot 13. Robot 13, which may be the model ATM 100 manufactured by Equipe Technologies of Mountain View, Calif., is a three-degree-of-freedom robot with the ability to place wafers anywhere in a cylindrical coordinate system. It has an end effector 14 which is capable of handling two wafers simultaneously. It pivots about an axis 15 approximately at the center of coating section 11. A similar robot 16 is positioned at the center of developing section 12.

Clustered about robots 13 and 16 are a series of processing modules. In coating section 11, a heating/cooling unit 17 contains modules 170A, 170B and 170C stacked three high. FIG. 1B illustrates an elevational view of heating/cooling unit 17. As shown in FIGS. 1A and 1B, modules 170A–170C each contain a central cool plate located between two ovens. Modules 170A–170C may each be of the kind described below in reference to FIGS. 2–10. A similar heating/cooling unit 18 is positioned in developing section 12.

Coating section 11 contains cassette input/output (I/O) units 19 and 20. Each cassette I/O unit holds a cassette containing a plurality of wafers, as shown in the elevational view of FIG. 1C, and they provide the means by which wafers are introduced into and withdrawn from photolithography system 10. Cassette I/O units 19 and 20 can be moved between a retracted position (see unit 19) to an operating position (see unit 20), in the latter of which the cassette faces the axis of robot 13. Both units are accessed from the front of system 10. Cassette I/O units 19 and 20 may each be of the kind described in co-owned application Ser. No. 08/092,842, filed Jul. 16, 1993, which is incorporated herein by reference.

Coating section 11 contains a spin coating unit 21, and developing section 12 contains two developing units 22 and 23. A central wafer pass-through buffer 24 is provided for transferring the wafers between coating section 11 and developing section 12, and an optional stepper buffer 25 may be provided for passing the wafers to an adjacent exposure system (not shown).

The components of photolithography system 10 are controlled by a main system controller 26. Heating/cooling modules 170A–170C have individual microcontrollers (not shown). Similarly, coating unit 21 has a microcontroller 21C and developing units 22 and 23 have microcontrollers 22C and 23C, respectively. Each of these microcontrollers is connected to the system controller 26 in a master-slave relationship, and they perform such functions as actuating air cylinders, controlling motors, monitoring sensors, dispensing chemicals, etc. The system controller 26 issues high level commands to and receives high level status information from the individual microcontrollers.

The manner of operation of system 10 depends on the particular processing sequence used and will be apparent to those skilled in the art. For example, robot 13 may initially take a wafer from cassette I/O unit 19 and transfer it to an oven in module 170A for the initial dehydration heating. When the dehydration heating is completed, the microcontroller in module 170A instructs controller 26, and robot 13 transfers the wafer from the oven to the cool plate of module 170A. When the cooling process is completed, controller 26 is again instructed, and robot 13 transfers the wafer to spin coating unit 21 where the photoresist is applied. Robot 13 then transfers the wafer from spin coating unit 21 back to an oven in heating/cooling unit 17 for a soft bake and to a cool plate for cooling.

After the coating process is completed and the wafer has been soft baked and cooled, robot 13 transfers the wafer to pass-through buffer 24, where robot 16 takes over. Robot 16 delivers the wafer to stepper buffer 25 for transfer to an external exposure unit, back to an oven in heating/cooling unit 18 for the post-exposure bake, and then to a cool plate in unit 18. This takes place under the control of a microcontroller in unit 18 and system controller 26. When the wafer has been properly cooled, it is transferred to one of developing units 22 or 23. After it has been developed, the wafer is transferred back to an oven in heating/cooling unit 18 for the "hard" bake, and then to a cool plate in heating/cooling unit 18. After the wafer has been cooled, it can be transferred via pass-through buffer 24 and robot 13 to one of cassette I/O units 19 or 20.

What has been described is a very compact, cost-efficient system for coating and developing wafers. Robots 13 and 16 are three-degree-of-freedom robots instead of the relatively complex six-degree-of-freedom robots that have been used in some prior art systems. As shown in the side elevational view of FIG. 1D, robot 13 can deliver or retrieve a wafer to or from the cooling section of any of the stacked modules 170A–170C in heating/cooling unit 17. Robot 16 can likewise access any of the modules in heating/cooling unit 18. The amount of "dead space" surrounding robots 13 and 16 is kept to a minimum, and the space occupied by the heating and cooling modules is likewise minimized by stacking them. In fact, one embodiment of system 10 has a total footprint of only 29.5 square feet.

Many alternative embodiments are possible within the broad principles of this invention. Several of these alternative embodiments are illustrated in FIGS. 1E–1H. FIG. 1E illustrates a photolithography system with a single heating/cooling unit 51 and units 52 and 53 which can be either coaters or developers. In the preferred model of this embodiment, heating/cooling unit 51 includes only a single module (similar to module 170C). A pair of cassette I/O units 54 and 55 are also included. The footprint of this embodiment may be as little as 17.1 square feet. FIG. 1F illustrates a system similar to that shown in FIG. 1E except that cassette I/O unit 55 is omitted. The footprint may be as little as 15.2 square feet. FIG. 1G illustrates a system with the same components as FIG. 1E, except that the cassette I/O units 54 and 55 are positioned for front access to the system, while coater/developer units 52 and 53 are positioned on the sides. The footprint may be as little as 17.1 square feet. FIG. 1E illustrates a system similar to system 10 shown in FIG. 1A, except that cassette I/O unit 20 has been replaced by a second spin coating unit 56. The footprint may be as low as 29.5 square feet.

FIG. 2A illustrates a plan view of a clustered semiconductor substrate photolithography system 110 of the kind described above in reference to FIGS. 1A–1H. System 110 includes a thermal process module (also referred to as "module" above and as "TPM" in Appendix A) 112 in accordance with the invention. Although only one thermal process module 112 is shown in FIG. 2A, two or more thermal process modules 112 may be stacked on top of each other in system 110. Each thermal process module 112 includes a module controller 122, hot plate assemblies 124, 126 and cool plate assembly 128.

System 110 includes several components in addition to thermal process module 110. At the center of system 110 is a substrate handling robot 132. Robot 132, which may be the model ATM 100 manufactured by Equipe Technologies of Mountain View, Calif., is a simple, three-degree-of-freedom robot with the ability to place substrates anywhere in a cylindrical coordinate system. Robot 132 has an end effector 134 which is capable of handling two substrates simultaneously.

Clustered about robot 132 are a cassette input/output (I/O) unit 140, and two coating/developing (C/D) sections 142 and 144. Cassette I/O unit 140 holds a substrate cassette containing a plurality of substrates and provides the means by which substrates are introduced into and withdrawn from photolithography system 110. Coating/developing (C/D) sections 142 and 144 contain spin coating machines for coating the substrates with photoresist or developing units for developing the photoresist.

Figure 2:
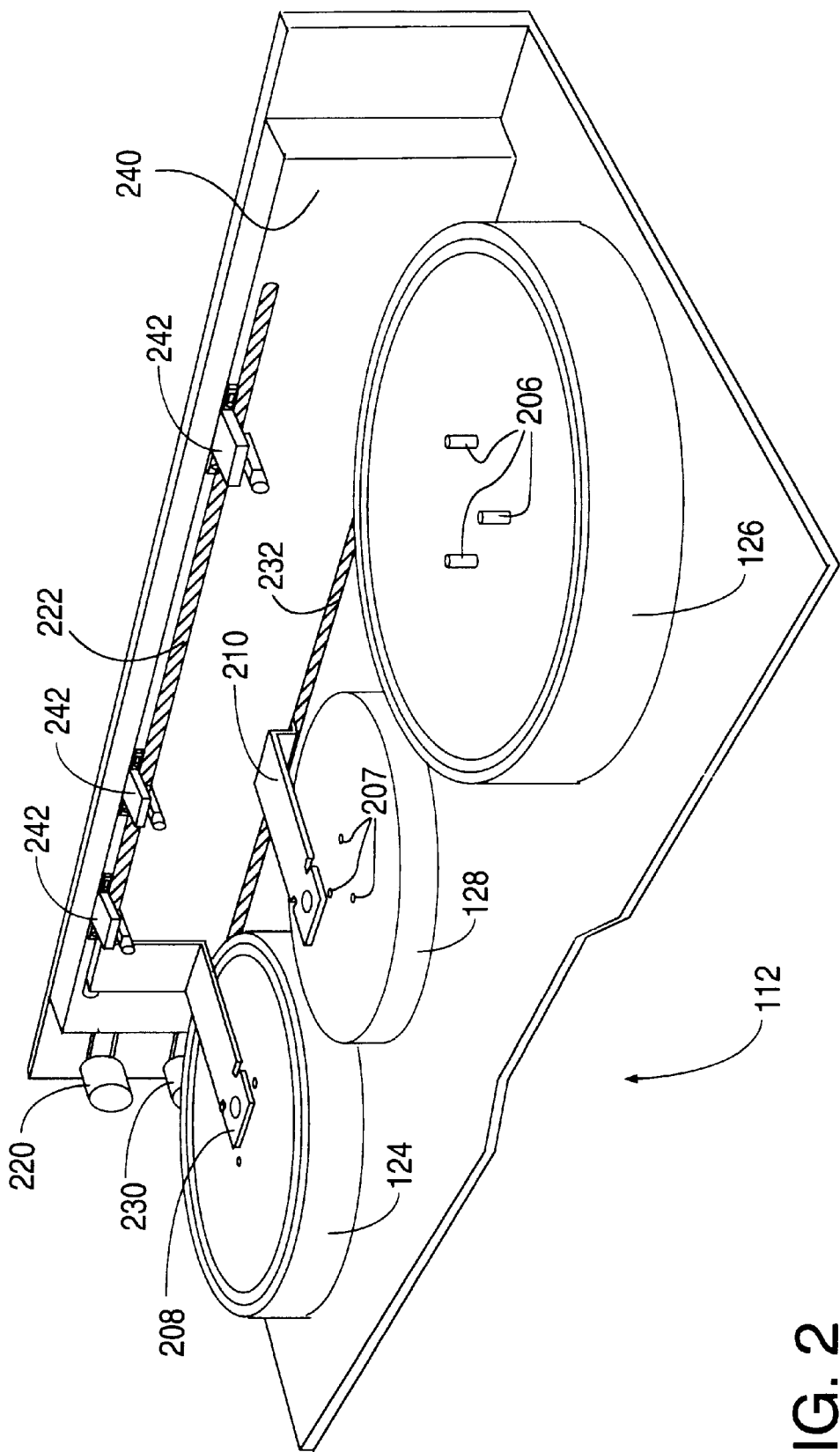
FIG. 2A illustrates a plan view of a clustered semiconductor substrate photolithography system.
FIG. 2B illustrates a perspective view of a thermal process module in accordance with the invention.

FIG. 2B illustrates a perspective view of thermal process module 112. As shown in FIG. 2, thermal process module 112 includes two hot plate assemblies 124 and 126 and a cool plate assembly 128.

Substrates are always transferred by end effector 134 of robot 132 (FIG. 2A) only to or from the cool plate assembly area of thermal process module 112. Cool plate assembly 128 as well as hot plate assemblies 124 and 126 are provided with lift pins 206 (FIG. 2B) for transfer of a substrate to and from the cool plate or hot plate surface. Three lift pins 206 are provided in each assembly 124, 126, 128 to support the substrate. Lift pins 206 can be translated in the vertical direction in lift pin holes 207. In FIG. 2B, lift pins 206 are shown retracted into a down position within lift pin holes 207 in assemblies 124 and 128.

Once a substrate has been placed in the cool plate assembly area, the substrate may be moved to one of hot plate assemblies 124 or 128 by one of two local linear transfer arms 208 or 210. Upper local linear transfer arm 208 is driven by a motor 220 and translates in a slot 222 in wall 240. Similarly, lower transfer arm 210 is driven by motor 230 and translates in a slot 232 in wall 240. For clarity, slots 222 and 232 are shown with hatched lines. Slots 222 and 232 are of sufficient length so that either of transfer arms 208 or 210 can move to the center of either of hot plate assemblies 124 and 128. When not in use, transfer arms 208 and 210 are kept in a home position between cool plate assembly 128 and one of adjacent hot plate assemblies 124 and 126.

Figure 3A:
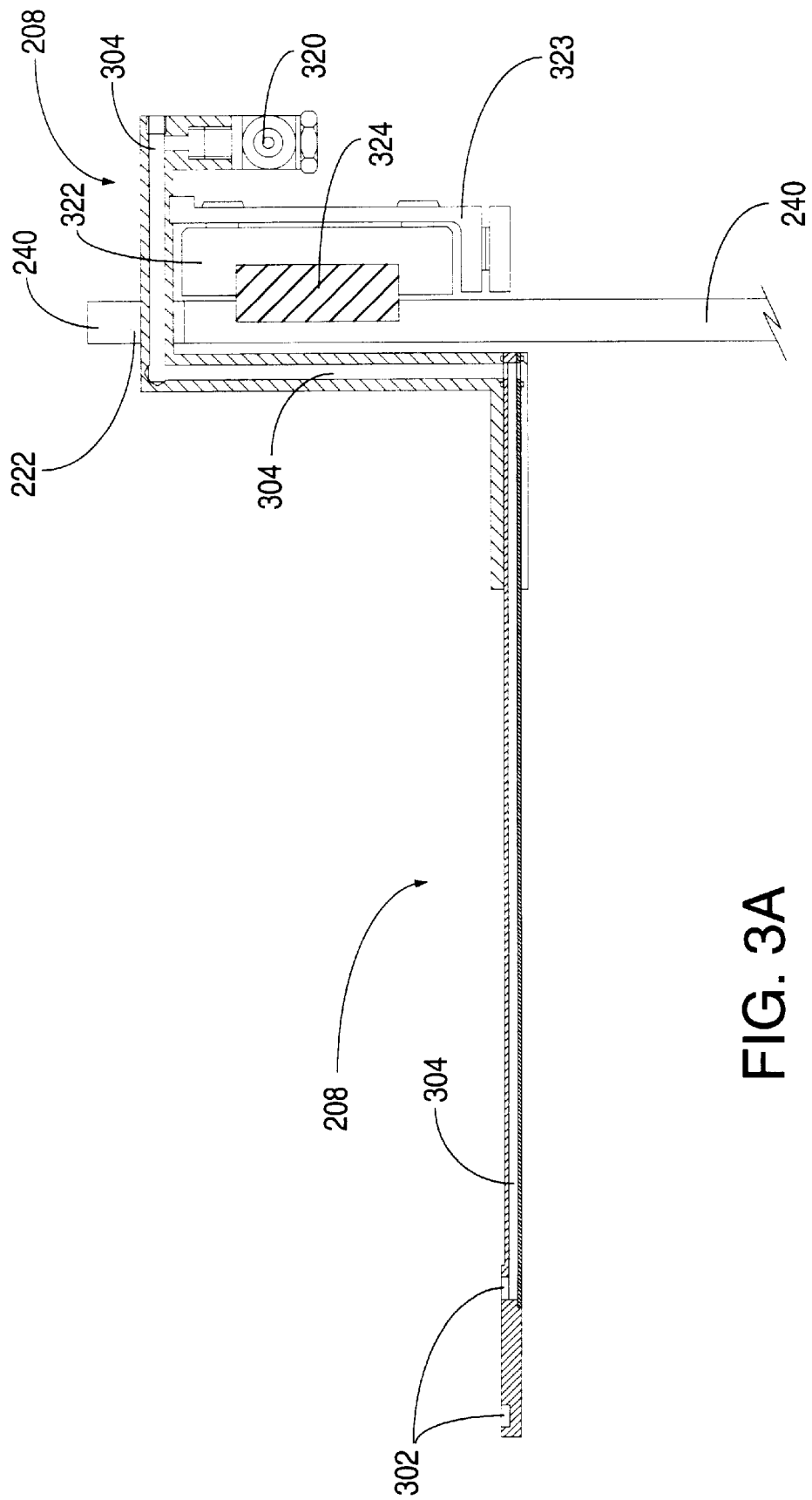
FIG. 3A illustrates a cross-sectional side view of a transfer arm carriage that supports a transfer arm behind a wall of the thermal process module.

FIG. 3A illustrates a cross-sectional side view of a transfer arm carriage 322 that supports a portion of transfer arm 208 that extends behind wall 240. As shown in FIG. 3A, transfer arm 208 is mounted on transfer arm carriage 322 by a bracket 323. Transfer arm carriage 322 is a simple carriage with bearings that slides along a rail 324 mounted in wall 240. Since carriage 322 is rigidly connected to transfer arm 208, transfer arm 208 moves with carriage 322 whenever carriage 322 is driven by motor 220 (FIG. 2B).

Transfer arm 208 has a vacuum clamp 302 (FIG. 3A) which is supplied vacuum by line 304 inside arm 208. Line 304 is formed in transfer arm 208 in the conventional manner. Line 304 is connected via a T-connector 320 to a vacuum tube mechanism (FIG. 3B).

Figure 3B:
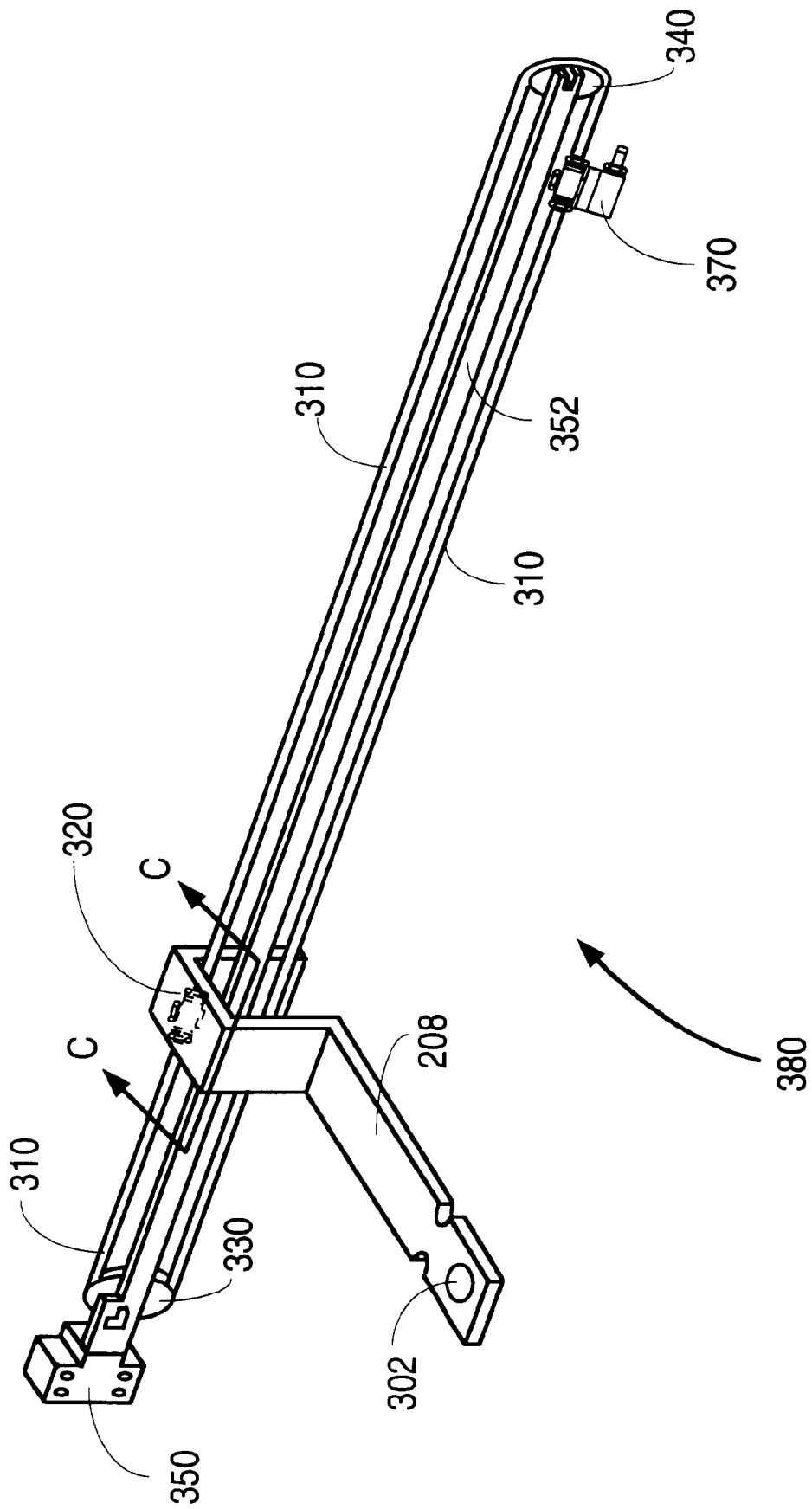
FIG. 3B illustrates a perspective view of a vacuum tube mechanism that supplies vacuum to a vacuum line of a transfer arm.
Figure 3C:
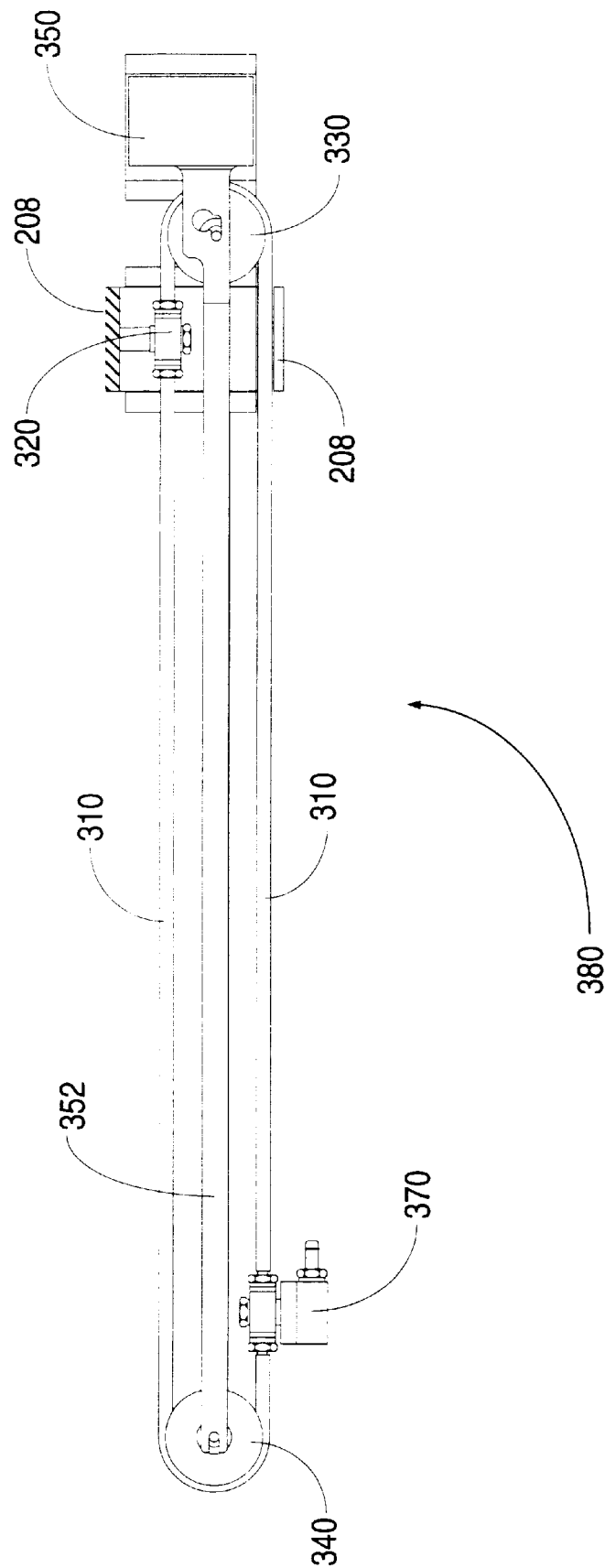
FIG. 3C illustrates a rear elevation view of a vacuum tube mechanism.

FIGS. 3B and 3C illustrate a perspective view and a rear elevation view, respectively, of a vacuum tube mechanism 380 that supplies vacuum to clamp 302 via line 304 of arm 208. As shown in FIG. 3B, tube mechanism 380 includes tube 310 which is wrapped around pulleys 330 and 340. Pulley 330 is supported by pulley carriage 350. Pulley carriage 350 has a long support arm 352 that supports pulley 340. Tube 310 has two T-connectors 320 and 370. T-connector 370 is rigidly fixed and connects tube 310 to a vacuum supply line in the housing wall (not shown). T-connector 320 connects tube 310 to transfer arm 208 (shown better in FIG. 3C). Since tube 310 is rigidly connected to transfer arm 208 (via T-connector 320), any movement of transfer arm 208 causes tube 310 to rotate pulleys 330 and 340. Since T-connector 370 is fixed, pulley carriage 350 translates in the same direction as transfer arm 208, albeit at one-half the velocity.

Figure 3D:
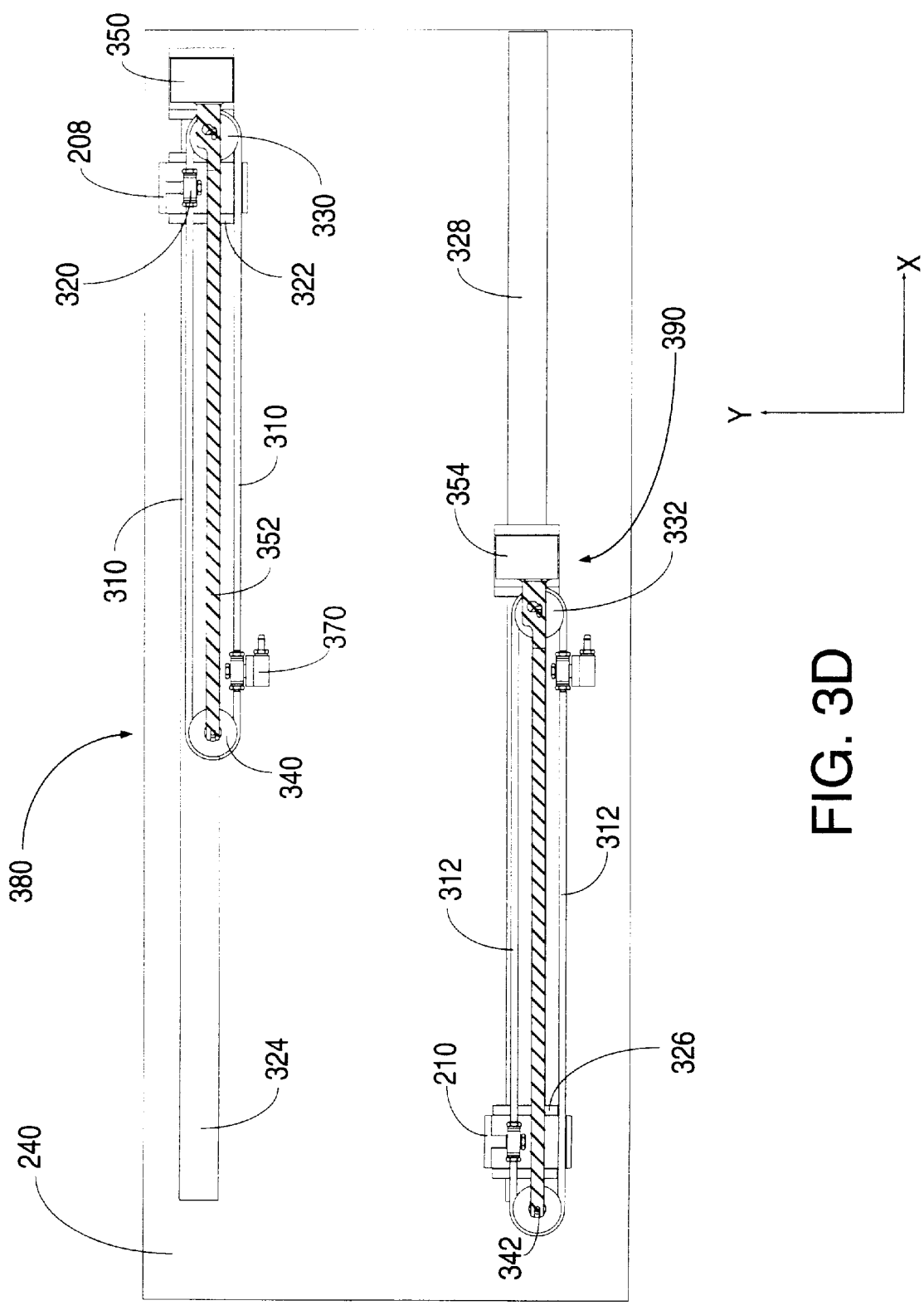
FIG. 3D illustrates a rear view of the thermal process module showing vacuum tube mechanisms mounted on a wall of the thermal process module.

FIG. 3D illustrates a rear view of the thermal process module showing tube mechanisms 380 and 390 mounted on housing wall 240. For clarity, wall 240 is shown without slots 222 and 232 and the Y-dimension distance is shown exaggerated. As shown in FIG. 3D, slide rail 324 on wall 240 supports pulley carriage 350 of tube mechanism 380. Since pulley carriage 350 supports both pulleys 330 and 340, the whole tube mechanism 380 can slide along rail 324. T-connector 370 connects tube 310 to a stationary vacuum line (not shown) in wall 240.

Tube mechanism 380 moves in the X direction along rail 324 in the following manner. A lower portion of tube 310 stays stationary at T-connector 370, while another portion of tube 310 at T-connector 320 moves with arm 208. The rest of tube mechanism 380 including tube 310, pulleys 330 and 340 and carriage 350 translate in the X direction at different speeds. Transfer arm carriage 322 travels at twice the speed of pulley carriage 350 since both carriages 350 and 322 ride on the same slide rail. When transfer arm carriage 322 reaches the left end of slide rail 324, pulley carriage 350 reaches the middle of slide rail 324. (Such a position of tube mechanism 380 is illustrated in FIG. 3D by the position of tube mechanism 390). In the preferred embodiment, pulleys 330 and 340 move a total distance of 12 inches, while carriage 322 (and transfer arm 208) moves a total distance of 24 inches.

Tube mechanism 390, which guides transfer arm 210, operates in a similar manner, with tube 312 rotating pulleys 332 and 342 and transfer arm carriage 326 and pulley carriage 354 sliding on slide rail 328.

The above described tube mechanism permits vacuum to be supplied to arms 208 and 210 while keeping the vacuum tubing in a compact space with limited movement. Such a unique pulley arrangement eliminates loose tubing and the associated dangers of tubing getting caught in the path of a robot arm or a belt and getting chewed up and broken.

FIGS. 4A and 4B illustrate the rear elevation view and the front elevation view respectively of thermal process module 112 (without hot plate assemblies 124, 126 and cool plate assembly 128). Transfer arm carriage 322 of upper tube mechanism 380 is attached to and driven by a belt 412. As noted above, movement of carriage 322 causes pulley carriage 350 and associated pulleys 330 and 340 to move at half the speed of carriage 322. In this manner, belt 412 causes mechanism 380 to translate along the X-direction. Similarly, a belt 414 is attached to transfer arm carriage 326 and causes lower transfer arm mechanism 390 to translate along the X-direction.

Belts 412 and 414 are toothed belts that are driven independently of each other by motors 422 and 424. Thus transfer arms 208 and 210 likewise move independently of each other. Independent movement of transfer arms 208 and 210 ensures that substrates can be transferred from or to any hot plate assembly or cool plate assembly independently of what is happening in the rest of the thermal process module.

Motors 422 and 424 that drive transfer arms 208 and 210 are electrically controlled by a microprocessor based module controller 122 (FIG. 2A). Encoders (not shown) monitor each of motors 422 and 424 to provide feedback to module controller 122. Therefore the precise position and the movement of transfer arms 208 and 210 is controlled by module controller 122. Module controller 122 senses the position of transfer arms 208 and 210 via three upper transfer arm position sensors 242 and three lower transfer arm position sensors 442 (FIG. 4B). Position sensors 242 and 442 are triggered by position signalling flags 408 and 410 that are carried by transfer arms 208 and 210 respectively. Position sensors 242 and 442 are conventional optical interrupters such as those available from Omron Corp. of One East Commerce Drive, Schaumburg, Ill. 60173.

Figure 5A:
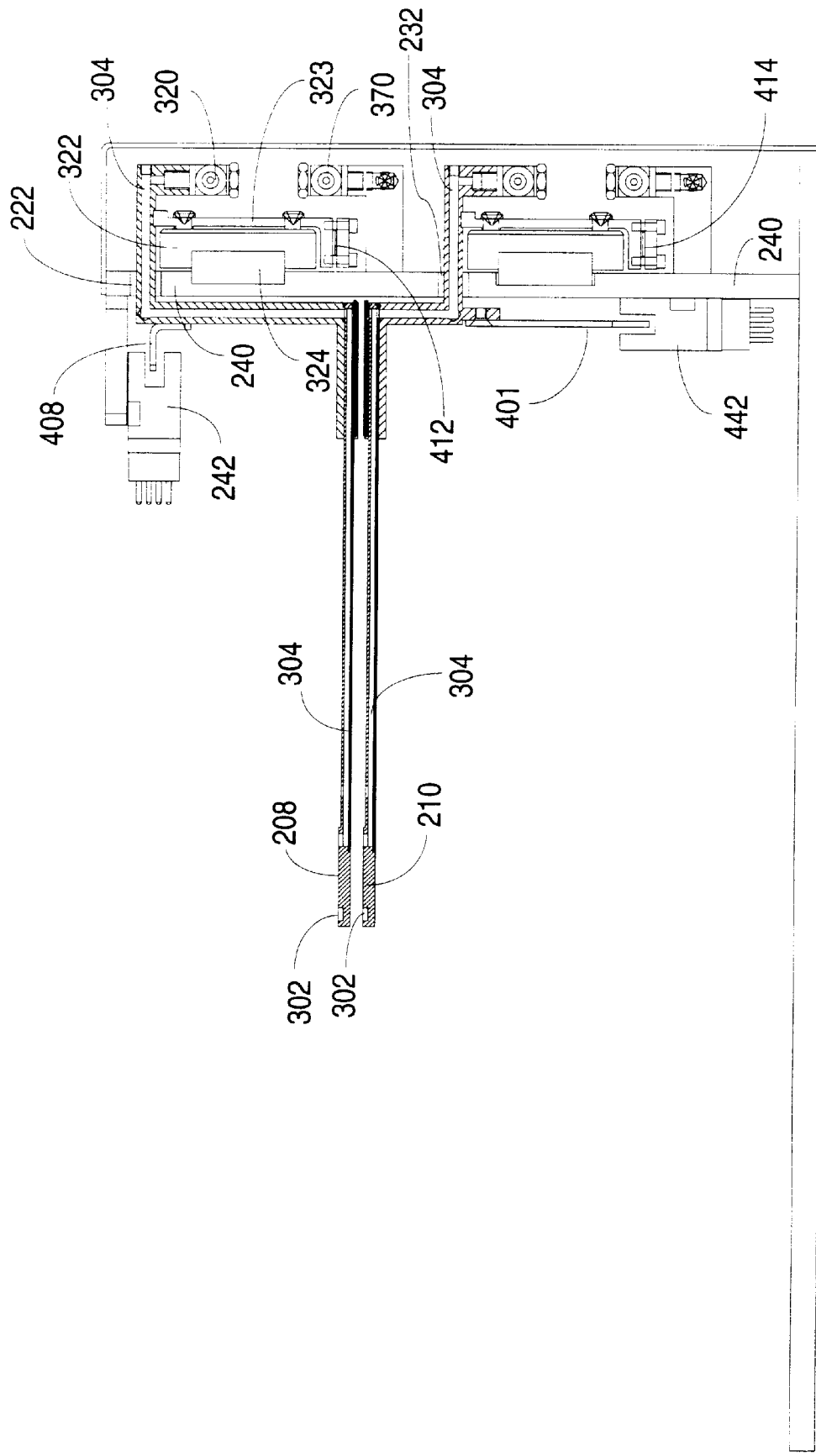
FIG. 5A illustrates a side view of the thermal process module.

FIG. 5A illustrates a side view of thermal process module 112. As shown in FIG. 5A, adequate vertical clearance is provided between transfer arms 208 and 210 so that transfer arms 208 and 210 can pass each other while carrying a substrate. In the preferred embodiment, there is a quarter inch distance between the elevations of the transfer arms 208 and 210.

Also, as shown in FIG. 5A, upper transfer arm position sensors 242 are mounted horizontally and are triggered by the passage of L-shaped flag 408 through them. Lower transfer arm position sensors 442 are mounted vertically and are triggered by passage of triangular shaped flag 410 (through them).

Figure 5B:
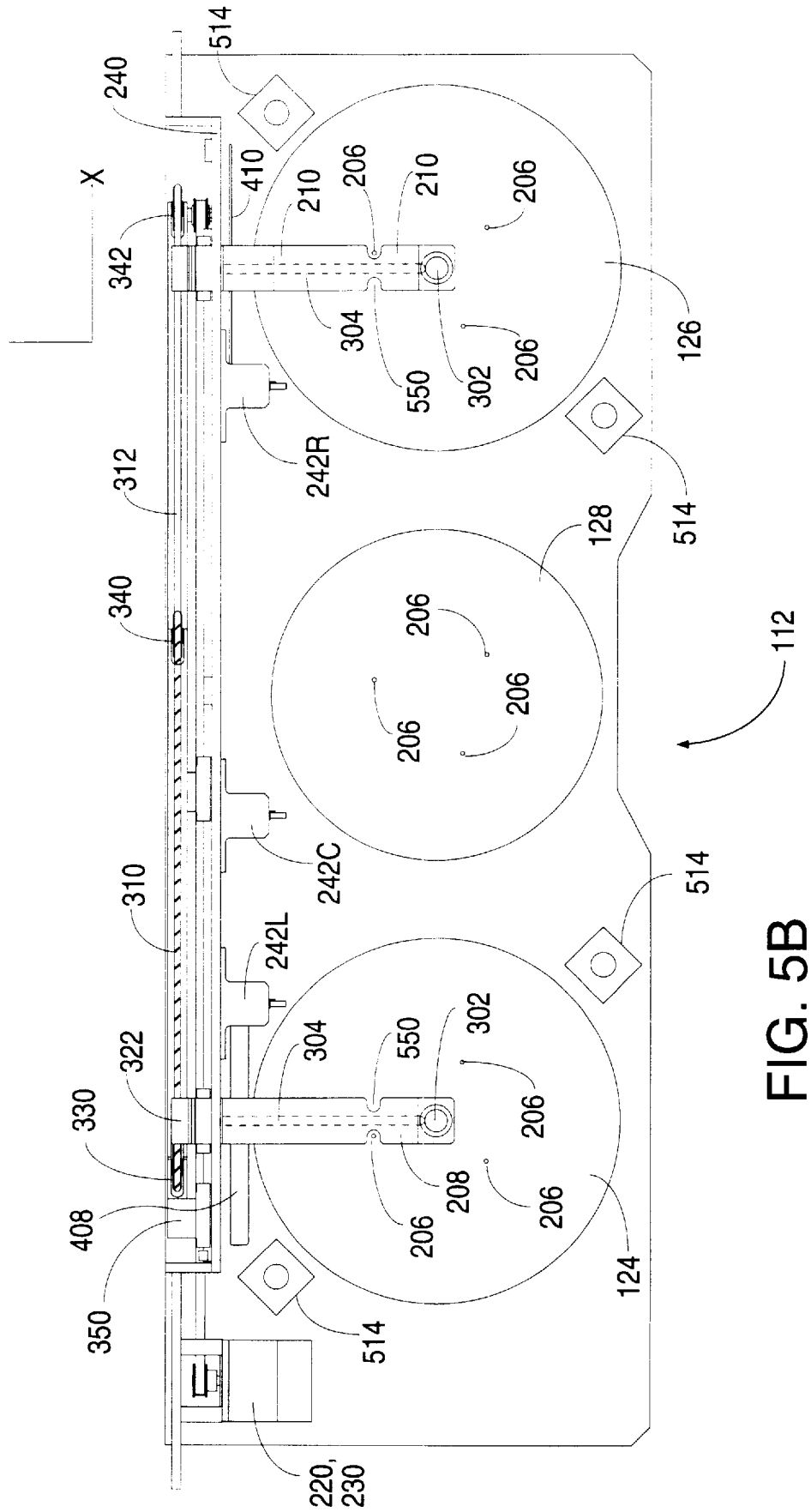
FIG. 5B illustrates a plan view of the thermal process module.

FIG. 5B illustrates a plan view of thermal process module 112. As shown in FIG. 5B, transfer arms 208 and 210 have sufficient length so that each arm reaches the center of hot plate assemblies 124 and 126 in the Z direction. Also, transfer arms 208 and 210 are provided with slots 550 so that each transfer arm can move in the X-direction to the center of either hot plate without being obstructed by lift pins 206. Each of transfer arms 208 or 210 may be kept by module controller 122 in a home position between cool plate assembly 128 and either of hot plate assemblies 124 and 126.

In FIG. 5B, upper position sensors 242 have been individually labeled as 242L, 242C, and 242R. Module controller 122 (FIG. 2A) determines that a transfer arm is over a hot plate, a cool plate or in a rest position based on the outputs Limit 1, Home and Limit 2 respectively of position sensors 242L, 242C and 242R. For example, if a transfer arm 208 is over hot plate assembly 124, then sensor 242L is interrupted. Sensor 242L stays interrupted until flag 408 of arm 208 is completely clear of sensor 242L. Flag 408 is of adequate length so that flag 408 exits sensor 242L only after arm 208 is completely clear of hot plate 124 (see FIG. 4B). Right sensor 242R and lower transfer arm 210 are operated in a similar manner.

As shown in FIG. 5B, central sensor 242C is mounted off-center of cool plate assembly 128. This is done for the following reason. Initially, on powering up, module controller 122 does not know where transfer arms 208 and 210 are located. Movement of a transfer arm without knowledge of its initial location could result in collision of a transfer arm with lift pins 206 in one of the plate assemblies. Therefore, initially module controller 122 checks the output of central sensor 242C. If central sensor 242C is interrupted, microprocessor 122 concludes that transfer arm 208 is off-center to the left side (toward 242L) and therefore moves transfer arm 208 to the home position between hot plate assembly 124 and cool plate assembly 128. If central sensor 242C is not interrupted, microprocessor 122 concludes the reverse and moves transfer arm 208 to a home position between assemblies 126 and 128.

Figure 6:
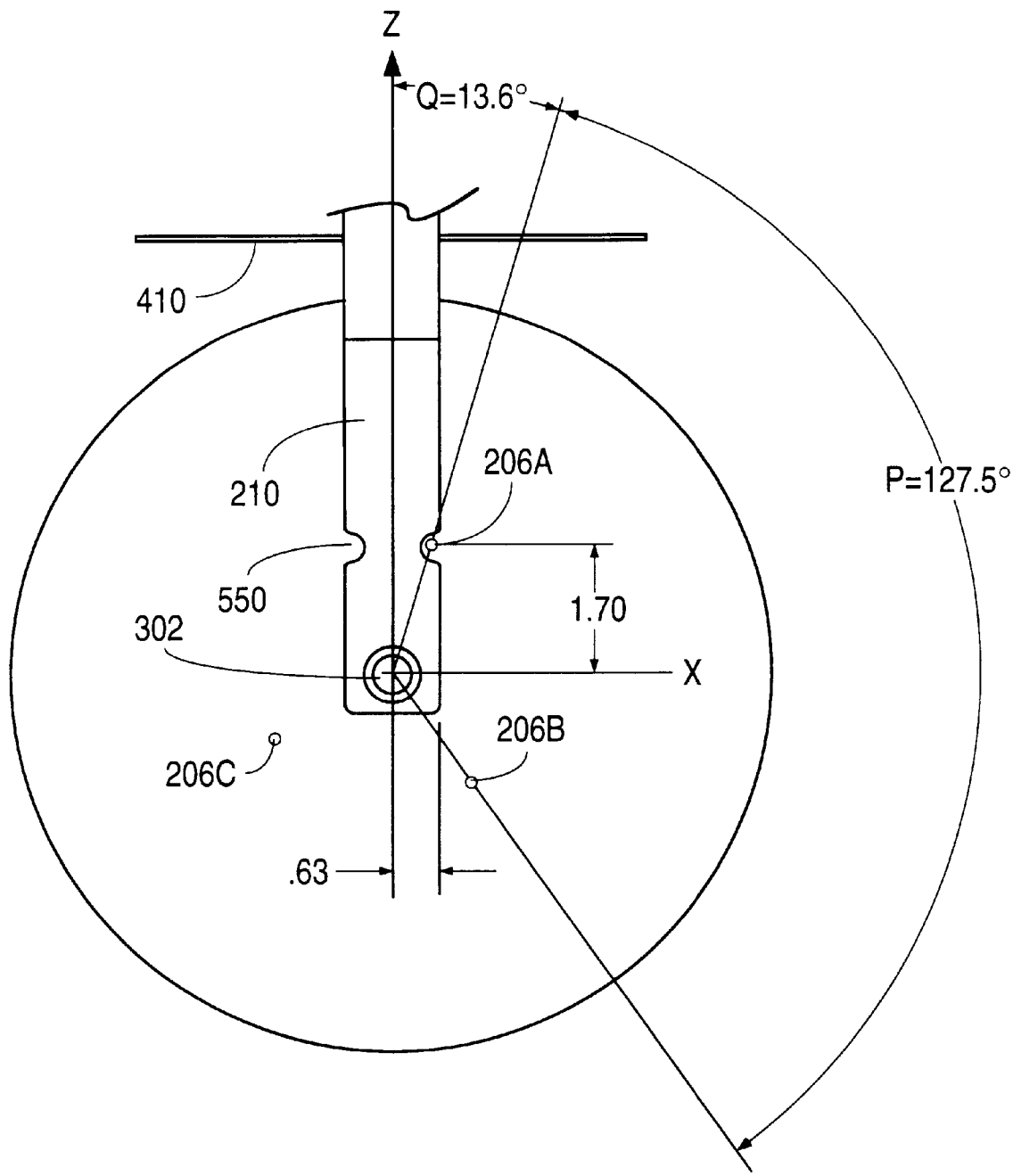
FIG. 6 illustrates the dimensions of the transfer arms and the angular positions of the lift pins of the right side hot plate assembly and the cool plate assembly.

FIG. 6 illustrates the dimensions of the transfer arms and the angular positions of lift pins 206 (which have been individually labeled as 206A, 206B and 206C) of hot plate assembly 126 and cool plate assembly 128. Lift pins 206 on hot plate assembly 124 are configured in a mirror image configuration of FIG. 6. As shown in FIG. 6, each transfer arm has sufficient length so that the center of clamp 302 is concentric with the center of assembly 124, 126, 128. Such a length of a transfer arm permits vacuum clamp 302 to hold the substrate at the center of the substrate.

In the preferred embodiment, slots 550 are positioned 1.70 inch inward on transfer arm 210 as measured from the center of vacuum clamp 302. Slots 550 are semi-circular slots which are larger in diameter than the diameter of lift pins 206. Each transfer arm has a width of 1.25 inch.

Innermost lift pin 206A is positioned adjacent to an outer slot 550 of transfer arm 210 when transfer arm 210 is positioned over the center of hot plate assembly 126. Lift pin 206A is offset by an angle Q of 13.6° from the Z axis. The other lift pins 206B and 206C are positioned about the center of hot plate assembly 126 at the same radial distance as lift pin 206A but at an angle P of 127.5° with respect to innermost lift pin 206A. Lift pins 206 for cool plate assembly 128 are positioned in a configuration similar to the configuration for hot plate assembly 126 shown in FIG. 6. Lift pins 206 for hot plate assembly 124 are positioned in a mirror image configuration of lift pins 206 on hot plate assembly 126 of FIG. 6. The configuration of lift pins 206 on hot plate assemblies 124 and 126 permits each transfer arm 208, 210 to move up to the center of either hot plate assembly 124 or 126 without being obstructed by lift pins 206, even if lift pins 206 are in their fully lifted position above hot plate assembly 124 or 126.

Lift pins 206A, 206B and 206C can move a substrate (not shown) from or to a hot plate or cool plate assembly 124, 126 or 128 so that the substrate may be transferred to or from a transfer arm 208 or 210. In the preferred embodiment, lift pins 206A, 206B and 206C may be lifted to one of two positions, the first position being quarter of an inch above the hot plate and the second position being half of an inch above the hot plate. Each of these positions corresponds to the elevation of one of the transfer arms 208 and 210. The distance between first and second positions is chosen to provide a clearance of 0.09 inch between the upper transfer arm 208 and a substrate on the lower transfer arm 210. Also, the distance of the first position is chosen to provide a clearance of 0.09 inch between the lower transfer arm 210 and a substrate on the cool plate. The first and second positions were chosen to correspond to the spacing inside a substrate cassette.

Figure 7:
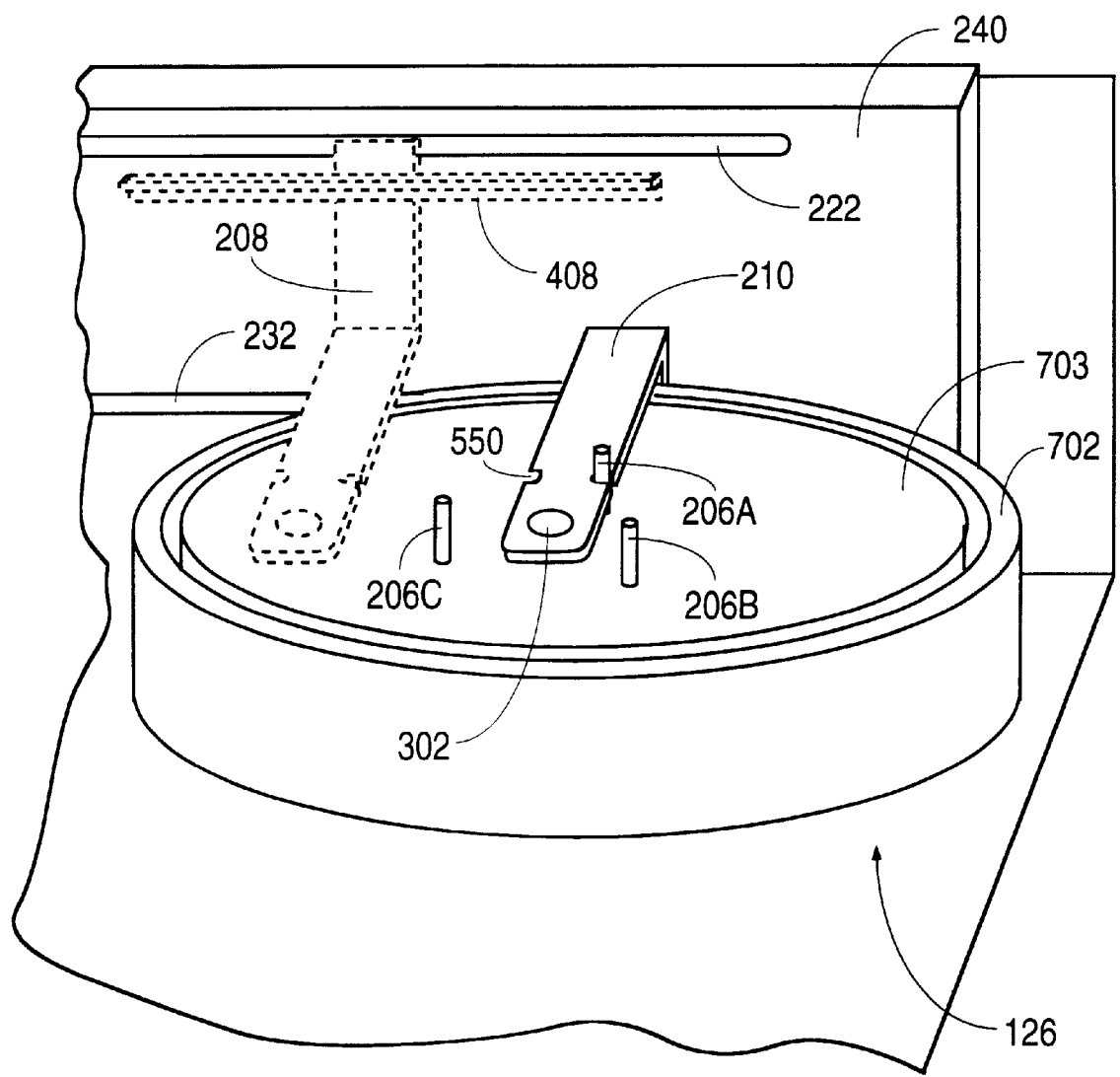
FIG. 7 illustrates a perspective view of a hot plate assembly of the thermal process module.

FIG. 7 illustrates a perspective view of a hot plate assembly of the thermal process module. Hot plate assembly 126 includes a housing 702 which surrounds a hot plate 703. Either of transfer arms 208 or 210 may be moved under a substrate once the substrate has been lifted by lift pins 206A, 206B and 206C. Module controller 122 (FIG. 2A) ensures that only one of the two transfer arms is positioned over a hot plate assembly at any one time (for this reason arm 208 is shown by a broken line).

Figure 8:
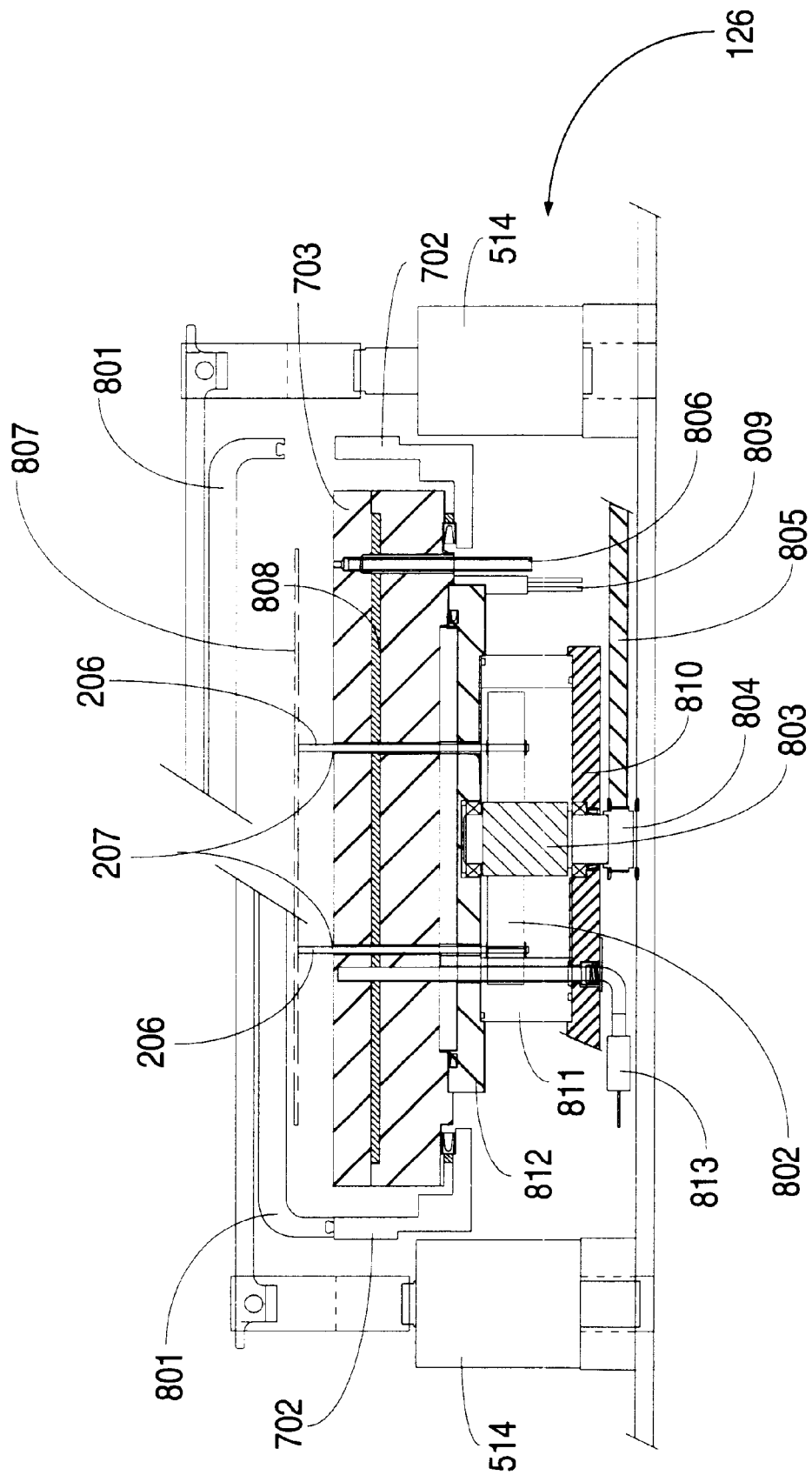
FIG. 8 illustrates a cross-sectional view of a hot plate assembly of the thermal process module taken from direction A—A shown in FIG. 2A.

FIG. 8 illustrates a cross-sectional view of hot plate assembly 126 taken from the direction A—A shown in FIG. 1. For illustrative purposes, some components of the hot plate assembly are shown in FIG. 8 although they would not be normally seen in the cross-sectional view. Hot plate assembly 126 is provided with an oven cover 801 to keep heat loss to a minimum. Oven cover 801 rests on housing 702 and may be lifted by cover lift cylinder 514. Lift cylinders 514 are arranged as shown in FIG. 5B to permit movement of transfer arms 208 and 210 up to the center of hot plate assemblies 124 and 126. Referring back to FIG. 8, lift cylinder 514 on the left side of FIG. 8 is shown in a retracted position so that oven cover 801 rests on housing 702. On the right side of FIG. 8, lift cylinder 514 is shown in an extended position so that oven cover 801 is lifted to allow a wafer 807 to be transferred into or out of hot plate assembly 126. Microprocessor 122 controls the opening and closing of oven cover 801 and ensures that a transfer arm is not underneath the oven cover while the cover is being shut. Also, as shown in FIG. 8, lift pins 206 are rigidly connected to a lift plate 802. Lift plate 802 is supported and moved by a central lead screw 803. Lead screw 803 ensures that the substrate is lifted by pins 206 parallel to hot plate 703. Lead screw 803 preferably has a large diameter (e.g. 1.0 inch) to provide stability to lift plate 802 and lift pins 206.

Lead screw 803 is rotated via a lead screw pulley 804 by timing belt 805. Timing belt 805 may be driven by a motor (not shown) controlled by module controller 122 (FIG. 2A). Hot plate 703 has vacuum lines 806 which supply vacuum to vacuum clamps (not shown) as well as to lift pin holes 207 so that a substrate 807 is held firmly in place while being heated. A thermocouple 813 is positioned so as to monitor the temperature of hot plate 703.

Hot plate assembly 124 is constructed as a mirror image of hot plate assembly 126.

Figure 9:
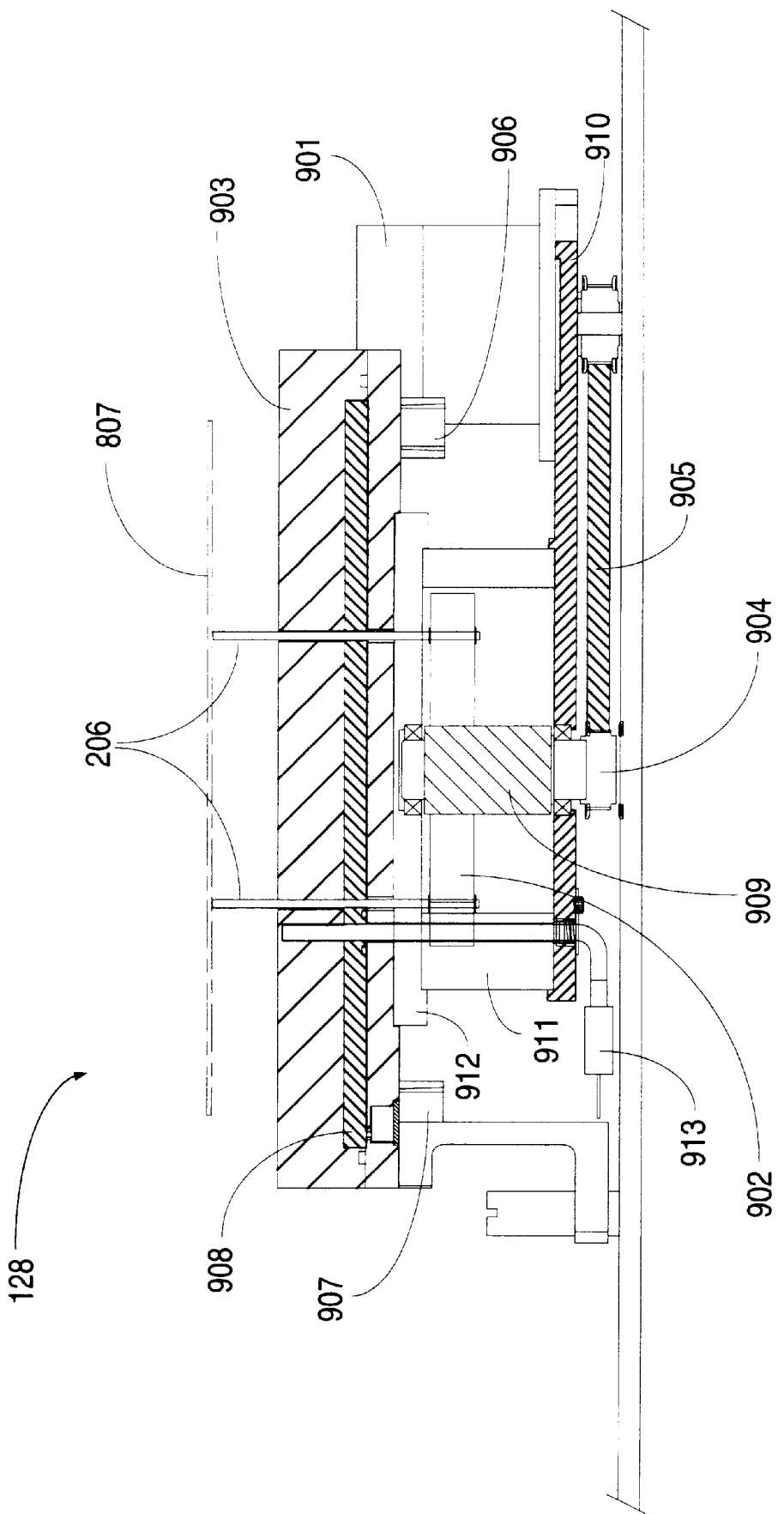
FIG. 9 illustrates a cross-sectional view of the cool plate assembly of the thermal process module taken from direction B—B shown in FIG. 2A.

FIG. 9 illustrates a cross-sectional view of the cool plate assembly of the thermal process module. Cool plate assembly 128 includes lift motor and encoder 901, chill plate 903, lift pins 206, lift plate 902, lead screw 909, pulley 904, timing belt 905 cooling water inlet 906, cooling water outlet 907, water channels 908 and mounting members 910, 911 and 912. A thermocouple 913 is positioned so as to monitor the temperature of chill plate 903. All of these components are similar to the components of the hot plate assembly described above in reference to FIG. 8, with one exception. Cool plate lift pins 206 may be lifted to three positions. Two of the positions are identical to the elevated positions of the hot plate lift pins and correspond to the elevations of transfer arms 208 and 210. Thus a half inch position of the cool plate lift pins corresponds to the quarter inch position of the hot plate lift pins and lower transfer arm 210. Similarly, a three quarters inch position of the cool plate lift pins corresponds to the half inch position of the hot plate lift pins and upper transfer arm 208. The third position is at an elevation below the first and second positions of the hot plate lift pins. To accommodate this third position, cool plate assembly 128 is mounted at a lower elevation than hot plate assemblies 124 and 126. This configuration allows cool plate lift pins 206 to hold a substrate in the third position while permitting transfer arms 208 and 210 to travel over cool plate assembly 128 while transferring substrates from one hot plate assembly to the other hot plate assembly. This configuration also allows a substrate to be placed in or retrieved from the area substantially above cool plate assembly 128 of thermal process module 112 by external robot 132. Any one of the three lift pin positions may serve as a robot transfer position for transfer of the substrate to the external robot.

Figure 10:
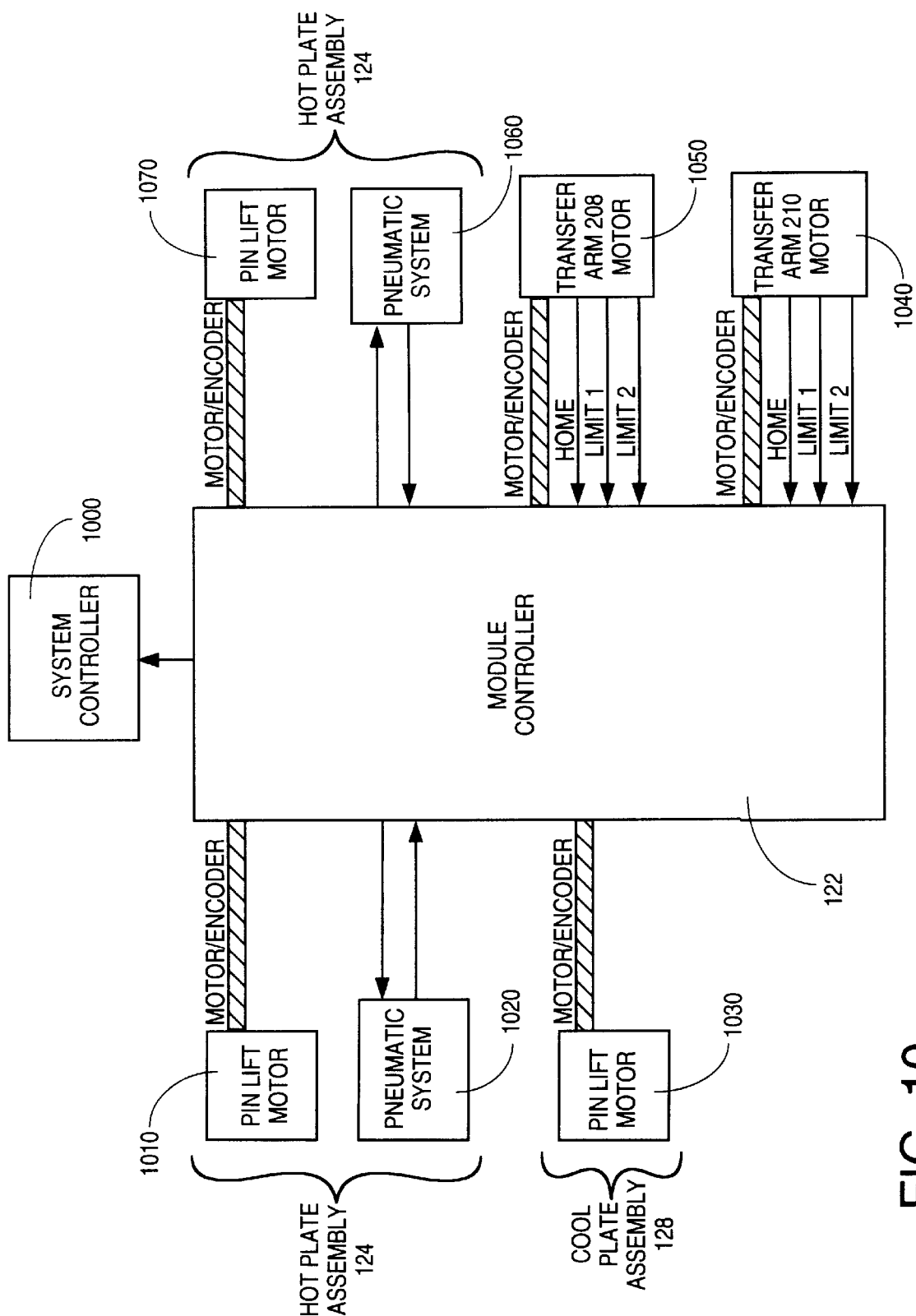
FIG. 10 is an illustrative block-diagram of a module controller used in the thermal process module.

FIG. 10 is an illustrative block-diagram of a module controller used in the thermal process module. As shown in FIG. 10, a module controller 122 is electrically connected to motors 1010, 1070 for moving lift pins 206; pneumatic systems 1020, 1060 for lifting the oven covers of hot plates 124 and 126; motor 1030 for moving the lift pins 206 of the cool plate and motors 1040, 1050 for moving transfer arms 208 and 210 and position sensors 242L, 242C and 242R (not shown) that communicate outputs Limit 1, Home and Limit 2 (as discussed above in reference to FIG. 5B). Pneumatic systems 1020, 1060 include lift cylinders 514 (see FIG. 8) and solenoid valves (not shown). Module controller 122 is also connected to the various sensors such as photo interrupters, thermocouples etc. (not shown in FIG. 10). Therefore module controller 122 can control each and every moving part in the thermal process module 112.

The manner of operation of photolithography system 110 will now be described. System 110 is controlled by a system controller 1000. System controller 1000 issues high level commands to and receives high level status information from module controller 122 for each of the thermal process modules 112. Each module controller 122 is connected to the system controller in a master-slave relationship.

Each module controller 122 assists the system controller in coordinating the functions of the thermal process module in which it resides. Module controller 122 performs such functions as scheduling bake times, actuating air cylinders and vacuum lines, controlling motors, monitoring sensors, dispensing chemicals, etc. Module controller 122 also synchronizes the operation of the transfer arms to ensure that there is no conflict between them. Module controller 122 plans ahead of time, prior to initiation of a bake cycle to ensure that the cool plate assembly will be available as soon as a substrate has finished its precise baking time in a hot plate assembly.

In the preferred embodiment, an Intel 80186 microprocessor is used for module controller 122. Two preferred methods for using the thermal process module are described in Appendix A that is incorporated herein as "Normal Operation Sequence: Parallel Operation" and "Normal Operation Sequence: Serial Operation." In parallel operation of thermal process module 112, each hot plate assembly is used alternately: a first substrate is baked in a hot plate assembly for its baking time and a second substrate is baked substantially simultaneously in a different hot plate assembly for its baking time. Therefore parallel operation of the thermal process module increases the total throughput of the system. In serial operation, each substrate goes through the same equipment sequentially: each substrate is baked first in one hot plate assembly and later transferred to and baked in the other hot plate assembly. Therefore in serial operation of the thermal process module, each substrate has the same baking history.

In the description in Appendix A "Substrate 1" refers to a first semiconductor wafer that is brought into the thermal process module 112 earlier than "Substrate 2" which refers to a second semiconductor wafer that is brought in later. Although transfer arms 208 and 210 and hot plate assemblies 124 and 126 are specifically referred to in Appendix A, these components may be exchanged for each other in accordance with this invention.

To illustrate the operation of the system, the transfer of a substrate to the cool plate assembly, to a hot plate assembly, and then back to the cool plate assembly will be described. When a substrate is to be heated, it is transferred from cassette I/O unit 140 by robot 132 to transfer arm 208 in an area adjacent chill plate 903. Then vacuum is applied to vacuum clamp 302 (FIG. 3) of arm 208 so that substrate 807 is securely held by transfer arm 208.

Module controller 122 then causes one of the hot plate assemblies 124 or 126 (in this example, assembly 126) to lift its cover 801. Then module controller 122 causes motor 220 to move transfer arm 208 (along with substrate 807) to a position above hot plate 703. Vacuum is released from clamp 302. Lift pins 206 are then raised to lift substrate 807 off transfer arm 208. Transfer arm 208 is moved back to its home position. Lift pins 206 are then lowered and vacuum is applied via line 806 to hold substrate 807 in place on hot plate 703. Cover 801 is lowered and substrate 807 is baked for the requisite time.

As soon as substrate 807 has completed baking, module controller 122 transfers substrate 807 from hot plate assembly 126 to cool plate assembly 128 in the following manner. Module controller 122 causes cover 801 to be lifted from housing 702. Vacuum is released from line 806 and substrate 807 is lifted by lift pins 206 to the one-half inch position, appropriate for transfer arm 208. Transfer arm 208 or 210 (in this example, transfer arm 208) is moved to the center of hot plate 703 under substrate 807. Then vacuum is applied to clamp 302 of transfer arm 208. Lift pins 206 are then retracted into a down position within lift pin holes 207 in assembly 126. Once substrate 807 is securely held by transfer arm 208 via clamp 302, transfer arm 208 along with substrate 807 is moved to the center of cool plate assembly 128 and vacuum is released. Module controller 122 ensures that the chill plate is always available when a substrate is finished baking by appropriate scheduling of the bake and cool times. Lift pins 206 are raised to lift substrate 807 off transfer arm 208. Transfer arm 208 is returned to its rest position and lift pins 206 are lowered so that substrate 807 rests on chill plate 903. Then vacuum is applied and substrate 807 is cooled for the requisite time.

When the cooling process is completed, module controller 122 informs the system controller. The system controller causes robot 132 to transfer the substrate to wherever the substrate needs to be sent next. For example, the substrate may be transferred to C/D section 142 where a spin coating machine may apply a layer of photoresist. Later on, the substrate may be transferred back to thermal process module 112 for the "soft" baking.

If for some reason a first substrate is finished cooling and is still present on the chill plate immediately prior to completion of baking of a second substrate, then module controller 122 causes the first substrate to be held on upper transfer arm 208 in a buffer position, so that the chill plate is vacated and available for cooling the second substrate. Thus when the second substrate is finished baking, the lower transfer arm 210 will move the second substrate from the hot plate assembly to the cool plate assembly. In this manner, none of the substrates are overbaked due to lack of availability of the chill plate. Also, since a cooled substrate may be held in the buffer position on a transfer arm, the throughput is not slowed down due to scheduling conflicts.

Although transfer arms move the substrates between the hot plate and cool plate assemblies, each transfer arm cools down when it is not actively moving a hot substrate. If both transfer arms are available, the cooler arm can be used to pick up a recently coated substrate from the cool plate and transfer it to the hot plate. Therefore, alternate use of the transfer arms permits a recently heated transfer arm to be given adequate time to cool off.

All these operations take place under the control of module controller 122 and the system controller. The system controller and module controller 122 co-operate to ensure that no more than two substrates are transferred into a thermal process module at any one time. While an operational example has been described above, those ordinary skilled in the art will be able to build a general module controller and system controller from the specific directions in Appendix A.

The thermal process module permits delivery of ambient temperature silicon substrates that are baked and cooled inside the module at precise temperatures for precise intervals of time. Substrates baked by the serial operation have consistently similar history of baking times and temperatures because each substrate undergoes the same process. In both serial and parallel operations, since there are as many transfer arms as there are hot plates, a transfer arm is always available whenever a substrate is finished baking. Thus there is no danger of overbaking. This increases yield.

Also, since the robot arm transfers substrates only from and to a cool plate assembly area and only handles cool substrates, the end effector never heats up. Since there is never any localized non-uniform heating of substrates, the substrates processed in accordance with this invention consistently have uniformly thick coatings.

Finally, the thermal process module of this invention is a very precise, compact and cost-efficient system for heating and cooling substrates. The thermal process module is compact since transfer arms 208 and 210 are relatively simple having a single-degree-of-freedom instead of the complex six-degree-of-freedom robots that have been used in some prior art systems. The amount of "dead space" surrounding arms 208 and 210 is kept to a minimum, and the space occupied by the hot plate and cool plate assemblies is likewise minimized by placing them adjacent each other. In fact, one embodiment of thermal process module 112 has a footprint of only 4.4 square feet so that the whole system 110 has a total footprint of only 15.2 square feet. Due to their small height, two or more thermal process modules can be stacked on top of each other and yet work with a single robot arm 132 (FIG. 2A). In a preferred embodiment, the total height of three thermal process modules is 17 inches which is easily serviceable by a robot arm.

Also, the unique compact pulley arrangement of the tube mechanism permits vacuum to be supplied to the transfer arms without any loose tubing.

The description of an embodiment of this invention is intended to be illustrative and not limiting. Numerous other embodiments will be apparent to those skilled in the art, all of which are included within the broad scope of this invention.

The specific elements in this invention are not limited to those discussed in reference to the preferred embodiment. For example, the thermal process module may be designed with a single cool plate, a single hot plate and a single transfer arm.

Also, the invention is not restricted to the described positions of the hot and cool plates. For example, the cool plate may be located in substantially the same plane as the plane of the hot plates. Or multiple cool plates and hot plates may be stacked on top of each other.

Also, the invention is not restricted to using two transfer arms or to transfer arms that move in parallel planes. For example, the transfer arms could move within the same plane, along non-conflicting contours or even in conflicting contours if the module controller schedules out the conflicts. Or a transfer arm could translate along a line at an angle oblique to the horizontal so that a cool plate could be located in a plane substantially distant from a hot plate plane and yet be serviced. Or a transfer arm could be mounted to pivot about a given point.

Finally, it would be apparent to a person of skill in the art to either integrate the functions in the module controllers of each thermal process module into the system controller, or alternatively to go to a more distributed processing environment than described above.

The apparatus and method according to this invention are not confined to semiconductor substrate photolithography systems, and can be used in any application that requires heating and cooling of objects. The broad scope of this invention is to be limited only by the following claims.

APPENDIX A

All substrates enter the Thermal Process Module 112 in the area of cool plate assembly 128. They are then transferred to the appropriate hot plate assembly/assemblies 124 and/or 126 and cool plate assembly 128 by transfer arms 208 and 210. The Thermal Process Module is capable of processing 2 substrates at the same time in either a parallel or a serial fashion. Parallel operation is characterized by alternating the hot plate assembly used to bake each substrate. The first substrate will be baked in hot plate assembly 124 and cooled on cool plate assembly 128. The next substrate will be baked in hot plate assembly 126 and cooled on the cool plate assembly 128. Serial operation is characterized by baking all substrates first in hot plate assembly 124, then in hot plate assembly 126 and finally cooling on cool plate assembly 128.

As each substrate is entered into Thermal Process Module 112, the control software calculates the time in the future that the substrate will have completed the baking steps and therefore need to be cooled. If any previous substrate is expected to be on cool plate 128 at that time, the control software will delay the transfer of the current substrate to hot plate assembly 124 or 126 until such time that cool plate assembly 128 is expected to be available when the current substrate will have completed the baking steps.

Idle Condition of the Thermal Process Module (TPM)

Hot plate assembly oven covers 801 closed
Hot plate assemblies at the correct temperature
All lift pins 206 in each assembly are in down position within lift pin holes 207 of their assembly
Both transfer arms 208 and 210 are in their home positions between hot plate assemblies 124 or 126 and cool plate assembly 128
No substrates are in the TPM Normal Operation Sequence: Parallel Operation 1. Transfer arm 208 moves over cool plate assembly 128 and turns on vacuum
2. Substrate 1 is entered into the TPM and placed on transfer arm 208
3. Oven cover 801 of hot plate assembly 124 is lifted
4. Transfer arm 208 moves to hot plate assembly 124
5. Transfer arm 208 turns vacuum off
6. Pins 206 of hot plate assembly 124 raise up (to the half inch position) and lift substrate 1 off of transfer arm 208
7. Transfer arm 208 moves to its home position between hot plate assembly 124 and cool plate assembly 128
8. Hot plate assembly 124 turns vacuum hold-down on
9. Pins 206 of hot plate assembly 124 lower substrate 1 onto the thermal surface of the hot plate
10. Oven cover 801 of hot plate assembly 124 is lowered and shut Some time later:
11. Transfer arm 208 moves over cool plate assembly 128 and turns on vacuum
12. Substrate 2 is entered into the TPM and placed on transfer arm 208
13. Wait for proper time
14. Oven cover 801 of hot plate assembly 126 is lifted
15. Transfer arm 208 moves to hot plate assembly 126
16. Transfer arm 208 turns vacuum off
17. Pins 206 of hot plate assembly 126 raise up (to the half inch position) and lift substrate 2 off of transfer arm 208
18. Transfer arm 208 moves to its home position between hot plate assembly 126 and cool plate assembly 128
19. Hot plate assembly 126 turns vacuum hold-down on
20. Pins 206 of hot plate assembly 126 lower substrate 2 onto the thermal surface of the hot plate
21. Oven cover 801 of hot plate assembly 126 is lowered and shut When hot Plate assembly 124 is finished baking substrate 1:
22. Oven cover 801 of hot plate assembly 124 is lifted
23. Hot plate assembly 124 turns vacuum hold-down off
24. Pins 206 of hot plate assembly 124 lift substrate 1 up to the lower transfer position (quarter inch position)
25. Transfer arm 210 moves under substrate 1 and turns on its vacuum
26. Pins 206 of hot plate assembly 124 lower substrate 1 onto transfer arm 210
27. Transfer arm 210 moves to the cool plate assembly 128
28. Transfer arm 210 turns vacuum off
29. Pins 206 of cool plate assembly 128 raise up (to the half inch position) and lift substrate 1 off of transfer arm 210
30. Transfer arm 210 moves to its home position between hot plate assembly 124 and cool plate assembly 128
31. Cool plate assembly 128 turns vacuum hold-down on
32. Pins 206 of cool plate assembly 128 lower substrate 1 onto the thermal surface of the chill plate After cool plate assembly 128 is finished cooling substrate 1:
33. Cool plate assembly 128 turns vacuum hold-down off
34. Pins 206 of cool plate assembly 128 raise substrate 1 up to the robot transfer position
35. Substrate 1 is removed from the Thermal Process Module at cool plate assembly 128

When hot plate assembly 126 is finished baking substrate 2:
36. Oven cover 801 of hot plate assembly 126 is lifted
37. Hot plate assembly 126 turns vacuum hold-down off
38. Pins 206 of hot plate assembly 126 lift substrate 2 up to the lower transfer position (quarter inch position)
39. Transfer arm 210 moves under substrate 2 and turns on its vacuum
40. Pins 206 of hot plate assembly 126 lower substrate 2 onto transfer arm 210
41. Transfer arm 210 moves to the cool plate assembly 128
42. Transfer arm 210 turns vacuum off
43. Pins 206 of cool plate assembly 128 raise up (to the half inch position) and lift substrate 2 off of transfer arm 210
44. Transfer arm 210 moves to its home position between hot plate assembly 124 and cool plate assembly 128
45. Cool plate assembly 128 turns vacuum hold-down on
46. Pins 206 of cool plate assembly 128 lower substrate 2 onto the thermal surface of the chill plate After cool plate assembly 128 is finished cooling substrate 2:
47. Cool plate assembly 128 turns vacuum hold-down off
48. Pins 206 of cool plate assembly 128 raise substrate 2 up to the robot transfer position
49. Substrate 2 is removed from the Thermal Process Module at cool plate assembly 128

The control software schedules all substrate transfers in order to ensure that there are no transfer conflicts and that every substrate can get to cool plate assembly 128 as soon as it has completed its baking. If there is a delay in removing a substrate from Thermal Process Module 112 and the next substrate is finished baking and is ready to transfer to cool plate assembly 128, the first substrate is placed on transfer arm 208 and held in this buffer position. This allows the second substrate to be transferred to cool plate assembly 128 with transfer arm 210 which can pass under transfer arm 208 while carrying the second substrate.

Normal Operation Sequence: Serial Operation

1. Transfer arm 208 moves over cool plate assembly 128 and turns on vacuum
2. Substrate 1 is entered into the TPM and placed on transfer arm 208
3. Oven cover 801 of hot plate assembly 124 is lifted
4. Transfer arm 208 moves to hot plate assembly 124
5. Transfer arm 208 turns vacuum off
6. Pins 206 of hot plate assembly 124 raise up (to the half inch position) and lift substrate 1 off of transfer arm 208
7. Transfer arm 208 moves to its home position between hot plate assembly 124 and cool plate assembly 128
8. Hot plate assembly 124 turns vacuum hold-down on
9. Pins 206 of hot plate assembly 124 lower substrate 1 onto the thermal surface of the hot plate
10. Oven cover 801 of hot plate assembly 124 is lowered and shut When hot plate assembly 124 is finished baking substrate 1:
11. Oven cover 801 of hot plate assembly 124 is lifted
12. Hot plate assembly 124 turns vacuum hold-down off
13. Pins 206 of hot plate assembly 124 lift substrate 1 up to the upper transfer position (half inch position)
14. Transfer arm 208 moves under substrate 1 and turns on its vacuum
15. Pins 206 of hot plate assembly 124 lower substrate 1 onto transfer arm 208
16. Oven cover 801 of hot plate assembly 126 is lifted
17. Transfer arm 208 moves to hot plate assembly 126
18. Transfer arm 208 turns vacuum off
19. Pins 206 of hot plate assembly 126 raise up (to the half inch position) and lift substrate 1 off of transfer arm 208
20. Transfer arm 208 moves to its home position between hot plate assembly 126 and cool plate assembly 128
21. Hot plate assembly 126 turns vacuum hold-down on
22. Pins 206 of hot plate assembly 126 lower substrate 1 onto the thermal surface of the hot plate
23. Oven cover 801 of hot plate assembly 126 is lowered and shut Some time later:
24. Transfer arm 208 moves over cool plate assembly 128 and turns on vacuum
25. Substrate 2 is entered into the TPM and placed on transfer arm 208
26. Wait for proper time
27. Oven cover 801 of hot plate assembly 124 is lifted
28. Transfer arm 208 moves to hot plate assembly 124
29. Transfer arm 208 turns vacuum off
30. Pins 206 of hot plate assembly 124 raise up (to the half inch position) and lift substrate 2 off of transfer arm 208
31. Transfer arm 208 moves to its home position between hot plate assembly 124 and cool plate assembly 128
32. Hot plate assembly 124 turns vacuum hold-down on
33. Pins 206 of hot plate assembly 124 lower substrate 2 onto the thermal surface of the hot plate
34. Oven cover 801 of hot plate assembly 124 is lowered and shut When hot plate assembly 126 is finished baking substrate 1:
35. Oven cover 801 of hot plate assembly 126 is lifted
36. Hot plate assembly 126 turns vacuum hold-down off
37. Pins 206 of hot plate assembly 126 lift substrate 1 up to the lower transfer position (quarter inch position)
38. Transfer arm 210 moves under substrate 1 and turns on its vacuum
39. Pins 206 of hot plate assembly 126 lower substrate 1 onto transfer arm 210
40. Transfer arm 210 moves to the cool plate assembly 128
41. Transfer arm 210 turns vacuum off
42. Pins 206 of cool plate assembly 128 raise up (to half inch position) and lift substrate 1 off of transfer arm 210
43. Transfer arm 210 moves to its home position between hot plate assembly 124 and cool plate assembly 128
44. Cool plate assembly 128 turns vacuum hold-down on
45. Pins 206 of cool plate assembly 128 lower substrate 1 onto the thermal surface of the chill plate When hot plate assembly 124 is finished baking substrate 2:
46. Oven cover 801 of hot plate assembly 124 is lifted
47. Hot plate assembly 124 turns vacuum hold-down off
48. Pins 206 of hot plate assembly 124 lift substrate 2 up to the upper transfer position (half inch position)
49. Transfer arm 208 moves under substrate 2 and turns on its vacuum
50. Pins 206 of hot plate assembly 124 lower substrate 2 onto transfer arm 208
51. Oven cover 801 of hot plate assembly 126 is lifted
52. Transfer arm 208 moves to hot plate assembly 126
53. Transfer arm 208 turns vacuum off
54. Pins 206 of hot plate assembly 126 raise up (to half inch position) and lift substrate 2 off of transfer arm 208
55. Transfer arm 208 moves to its home position between hot plate assembly 126 and cool plate assembly 128
56. Hot plate assembly 126 turns vacuum hold-down on
57. Pins 206 of hot plate assembly 126 lower substrate 2 onto the thermal surface of the hot plate
58. Oven cover 801 of hot plate assembly 126 is lowered and shut After cool plate assembly 128 is finished cooling substrate 1:
59. Cool plate assembly 128 turns vacuum hold-down off 60. Pins 206 of cool plate assembly 128 raise substrate 1 up to the robot transfer position
61. Substrate 1 is removed from the Thermal Process Module at cool plate assembly 128

When hot plate assembly 126 is finished baking substrate 2:
62. Oven cover 801 of hot plate assembly 126 is lifted
63. Hot plate assembly 126 turns vacuum hold-down off
64. Pins 206 of hot plate assembly 126 lift substrate 2 up to the lower transfer position (quarter inch position)
65. Transfer arm 210 moves under substrate 2 and turns on its vacuum
66. Pins 206 of hot plate assembly 126 lower substrate 2 onto transfer arm 210
67. Transfer arm 210 moves to the cool plate assembly 128
68. Transfer arm 210 turns vacuum off
69. Pins 206 of cool plate assembly 128 raise up (to half inch position) and lift substrate 2 off of transfer arm 210
70. Transfer arm 210 moves to its home position between hot plate assembly 124 and cool plate assembly 128
71. Cool plate assembly 128 turns vacuum hold-down on
72. Pins 206 of cool plate assembly 128 lower substrate 2 onto the thermal surface of the cool plate After cool plate assembly 128 is finished cooling substrate 2:
73. Cool plate assembly 128 turns vacuum hold-down off
74. Pins 206 of cool plate assembly 128 raise substrate 2 up to the robot transfer position
75. Substrate 2 is removed from the Thermal Process Module at cool plate assembly 128

The control software schedules all substrate transfers in order to ensure that there are no transfer conflicts and that every substrate can get to cool plate assembly 128 as soon as it has completed its baking. If there is a delay in removing a substrate from Thermal Process Module 112 and the next substrate is finished baking and is ready to transfer to cool plate assembly 128, the first substrate is placed on transfer arm 208 in a buffer position. This allows the second substrate to be transferred to cool plate assembly 128 with transfer arm 210 which can pass under transfer arm 208 while carrying the second substrate.

We claim:

1. A method of processing a substrate in a photolithography system, said photolithography system comprising a thermal process module including a first hot plate and a chill plate positioned side by side, a substrate handling robot and a component, said component being selected from a group consisting of a cassette input/output unit, and a coating/developing section, said method comprising:
   (i) transferring a substrate with said substrate handling robot from said component to a first position above said chill plate;
   (ii) moving said substrate horizontally from the first position to a second position above said first hot plate; and
   (iii) returning said substrate to said first position after said (ii) moving;
wherein said (ii) moving and said (iii) returning are performed by a mechanism other than the substrate handling robot.

2. The method of claim 1 wherein said (ii) moving and (iii) returning are performed using a linear transfer arm.

3. The method of claim 1 further comprising:
   transferring said substrate from said chill plate to a component of said photolithography system using said substrate handling robot after said (iii) returning.

4. The method of claim 1 further comprising:
   cooling said substrate on said chill plate subsequent to said (iii) returning.

5. The method of claim 1 further comprising:
   baking said substrate on said first hot plate prior to said returning.

6. The method of claim 5 wherein said photolithography system comprises a plurality of transfer arms, said method further comprising:
   scheduling at least the time of said baking such that a transfer arm is always available as soon as said substrate has finished said baking.

7. The method of claim 6 further comprising:
   holding said substrate in a buffer position so as to cause said chill plate to become available as soon as a second substrate has finished said baking step.

8. The method of claim 6 wherein said scheduling comprises:
   calculating the time in future that said substrate will have completed said baking; and
   delaying said transfer of said substrate from said position adjacent said chill plate to said hot plate if a previous substrate is expected to be on said chill plate at said calculated time.

9. The method of claim 5 wherein said photolithography system further comprises a second hot plate, said method further comprising:
   moving said substrate horizontally from said second position above said first hot plate to a third position above said second hot plate; and
   said returning comprises moving said substrate horizontally from said third position.

10. The method of claim 5 comprising:
    repeating each of said transferring, moving and returning for a plurality of substrates, each substrate being processed in a serial operation.

11. The method of claim 5 wherein said returning comprises transferring said substrate from said first hot plate.

12. The method of claim 5 wherein said photolithography system further comprises a second hot plate and said method comprises:
    repeating each of said transferring, moving and returning for a plurality of substrates, said baking comprising using one of said first hot plate and said second hot plate alternately in a parallel operation.

13. The method of claim 1 wherein:
    said first hot plate, said chill plate, a second hot plate, a first local linear transfer arm and a second local linear transfer arm are included in a thermal process module; and
    during any transfer of a substrate between said component and a part of said thermal process module said substrate is moved through said first position.

14. The method of claim 13 wherein during any transfer of said substrate to and from one of said first hot plate and said second hot plate, said substrate is moved at least through said first position.

15. The method of claim 1 wherein said photolithography system comprises (a) a first local linear transfer arm and (b) a second local linear transfer arm, said (i) transferring comprises using one of said first local linear transfer arm and said second local linear transfer arm to move said substrate linearly.

16. The method of claim 15 wherein said using comprises using the cooler of said arms during transfer of said substrate from said chill plate to said hot plate if both arms are available.

17. The method of claim 15 wherein said (i) transferring said substrate from said hot plate to said position adjacent said chill plate comprises:

using a plurality of pins included in said hot plate to move said substrate in a direction substantially perpendicular to the direction of said linear movement.

18. A method of processing a substrate in a photolithography system, said photolithography system comprising a hot plate, a chill plate, a plurality of transfer arms, a substrate handling robot and a component, said component being selected from a group consisting of a cassette input/output unit and a coating/developing section, said method comprising the steps of:

(i) transferring a substrate with said substrate handling robot from said component to a predetermined position adjacent said chill plate;

(ii) transferring said substrate with one of said transfer arms from said predetermined position to said hot plate;

(iii) baking said substrate on said hot plate;

(iv) returning said substrate from said hot plate to said predetermined position;

(v) transferring said substrate to said chill plate;

(vi) cooling said substrate on said chill plate; and (vii) scheduling the time of said baking and the time of said cooling such that one of said transfer arms is always available as soon as said substrate has finished said baking.

19. The method of claim 18 wherein said scheduling comprises:

calculating the time in future that said substrate will have completed said baking; and delaying said transfer of said substrate from said position adjacent said chill plate to said hot plate if a previous substrate is expected to be on said chill plate at said calculated time.

20. The method of claim 18 further comprising the step of holding said substrate in a buffer position so as to cause said chill plate to become available as soon as a second substrate has finished said baking.

21. The method of claim 18 wherein said transfer arm used in transferring said substrate from said predetermined position to said hot plate is the coolest of all available transfer arms.

22. A method of processing a substrate in a photolithography system, said photolithography system comprising: (1) a substrate handling robot, (2) a component selected from a group consisting of a cassette input/output unit and a coating/developing unit, and (3) a thermal process module including a plurality of hot plates, a chill plate and a plurality of transfer arms, each transfer arm capable of independently transferring a substrate between any hot plate and said chill plate, said method comprising:

(i) transferring a substrate with said substrate handling robot from said components to a transfer arm at a position adjacent said chill plate;

(ii) transferring said substrate with said transfer arm from the position adjacent said chill plate to one of said hot plates; and (iii) returning said substrate to said position adjacent said chill plate using any transfer arm in said plurality;

wherein said (ii) transferring and said (iii) returning are performed by the same transfer arm or a different transfer arm depending on availability.

23. The method of claim 22 wherein said (ii) transferring includes:

moving said substrate at least substantially vertically over each of said hot plate and said chill plate; and moving said substrate at least substantially horizontally between said hot plate and said chill plate.

24. The method of claim 22 wherein said (ii) transferring includes:

using the cooler of said transfer arms if both transfer arms are available.

* * * * *